US012672310B2

(12) United States Patent
Lee et al.

(10) Patent No.: US 12,672,310 B2
(45) Date of Patent: Jun. 30, 2026

(54) TRANSISTOR

(71) Applicants:Samsung Display Co., Ltd., Yongin-Si (KR); Korea University Research and Business Foundation, Seoul (KR)

(72) Inventors: Seungjun Lee, Suwon-si (KR); Sang Sig Kim, Seoul (KR); Jun Hyung Lim, Seoul (KR); Kyoung Ah Cho, Seoul (KR); Hee Sung Kong, Seoul (KR)

(73) Assignees: Samsung Display Co., Ltd., Yongin-Si (KR); Korea University Research and Business Foundation, Seoul (KR)

( * ) Notice: Subject to any disclaimer, the term of this patent is extended or adjusted under 35 U.S.C. 154(b) by 405 days.

(21) Appl. No.: 18/138,122

(22) Filed: Apr. 24, 2023

(65) Prior Publication Data

US 2024/0014325 A1     Jan. 11, 2024

(30) Foreign Application Priority Data

Jul. 6, 2022    (KR) ........................ 10-2022-0082831

(51) Int. Cl.
H01L 29/786        (2006.01)
H10D 30/67        (2025.01)

(52) U.S. Cl.
CPC ..... H10D 30/6734 (2025.01); H10D 30/6755 (2025.01)

(58) Field of Classification Search
CPC ............... H10D 30/6734; H10D 30/67; H10D 30/6755; H10D 30/675; H10D 30/6708;

H10D 30/6715; H10D 62/10; H10D 62/124; H10D 62/80; H10D 86/421; H10D 86/40; H10D 86/423; H10D 86/60; H10D 30/6757

See application file for complete search history.

(56) References Cited

U.S. PATENT DOCUMENTS

| | | | |
|---|---|---|---|
| 7,531,837 B2 | 5/2009 | Liu | |
| 9,379,249 B2 * | 6/2016 | Ji | ........................... H10D 99/00 |
| 11,677,030 B2 * | 6/2023 | Sohn | ................... H10D 84/0128 |
| | | | 257/43 |
| 2014/0291669 A1 * | 10/2014 | Ji | ........................... H10D 86/60 |
| | | | 257/43 |

(Continued)

FOREIGN PATENT DOCUMENTS

| | | |
|---|---|---|
| JP | 2019-67791 A | 4/2019 |
| KR | 10-1993-0020656 A | 10/1993 |

(Continued)

OTHER PUBLICATIONS

Zhao et al, "Realization of 2D metals at the angstrom thickness limit", 2025, Nature, vol. 639, pp. 354-359, Mar. 13, 2025.*

(Continued)

*Primary Examiner* — Nikolay K Yushin
(74) *Attorney, Agent, or Firm* — Innovation Counsel LLP

(57)        ABSTRACT

A transistor is disclosed that includes an active layer and a gate electrode. The active layer includes a first conductor layer including metal atoms, a layer of semiconductor material disposed above the first conductor layer, and a second conductor layer disposed above the semiconductor material layer and including the metal atoms. The gate electrode overlaps a part of the active layer and is electrically insulated from the active layer.

20 Claims, 15 Drawing Sheets

(56)                  References Cited

U.S. PATENT DOCUMENTS

| | | | |
|---|---|---|---|
| 2015/0228803 A1 | 8/2015 | Koezuka et al. | |
| 2019/0097059 A1 | 3/2019 | Kikuchi et al. | |
| 2021/0399141 A1 | 12/2021 | Li et al. | |
| 2021/0408292 A1* | 12/2021 | Sohn | H10D 30/6755 |

FOREIGN PATENT DOCUMENTS

| | | |
|---|---|---|
| KR | 10-0876081 B1 | 12/2008 |
| KR | 10-1829805 B1 | 2/2018 |
| KR | 10-2021-0158323 A | 12/2021 |
| KR | 10-2022-0002209 A | 1/2022 |

OTHER PUBLICATIONS

M. H. Rabbi, M. M. Billah, A. B. Siddik, S. Lee, J. Lee, J. Jang, Extremely Stable Dual gate Coplanar Amorphous InGaZnO Thin Film Transistor With Split Active Layer by N2O Annealing, IEEE Electron Device Lett. 41 (2020) 1782-1785.

J. Yang, J. Choi, S. Cho, J. Pi, H. Kim, C. Hwang, K. Park, S. Yoo, Highly Stable AlInZnSnO and InZnO Double-Layer Oxide Thin-Film Transistors With Mobility Over 50 cm2/Vs for High-Speed Operation, IEEE Electron Device Lett. 39 (2018) 508-511.

H. Yabuta, M. Sano, K. Abe, High-mobility thin-film transistor with amorphous InGaZnO4 channel fabricated by room temperature rf-magnetron sputtering, Appl. Phys. Lett. 89 (2006) 112123.

K. Son, J. Jung, K. Lee, T. Kim, J. Park, Y. Choi, K. Park, J. Kwon, B. Koo, S. Lee, Characteristics of Double-Gate Ga—In—Zn—O Thin-Film Transistor, IEEE Electron Device Lett. 31 (2010) 219-221.

Chi-Sun Hwang, Sung Haeng Cho (2020). Trends in Oxide TFT Technology, The Korean Information Display Society, 21(4), 3-13.

Wei-Sheng Liu et al., "Device Performance Improvement of Transparent Thin-Film Transistors", IEEE Transactions on Electron Devices, vol. 64, No. 6, Jun. 2017, 9 pages.

* cited by examiner

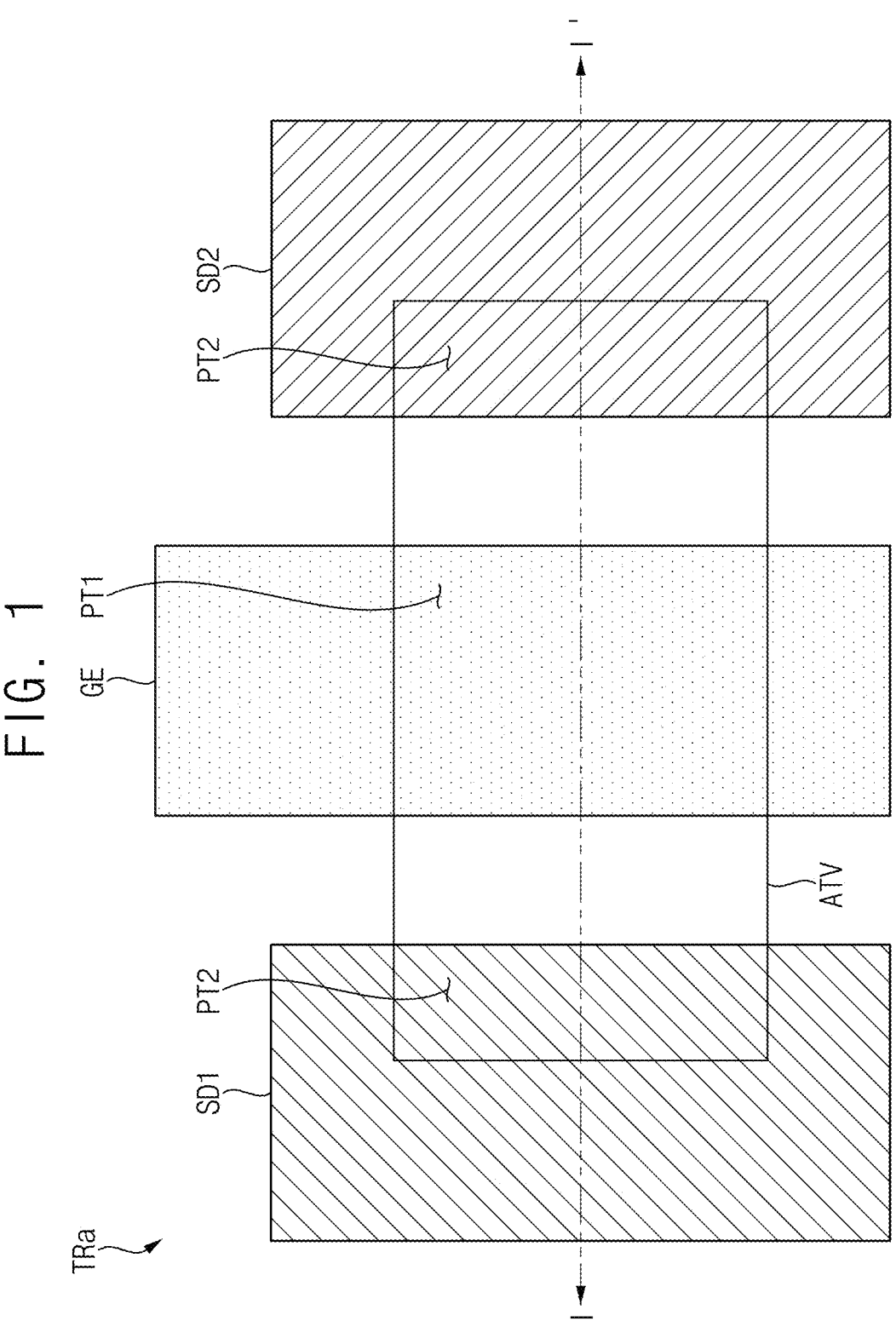
F I G. 1

SD:SD1,SD2
ATV:CL1,SCL,CL2

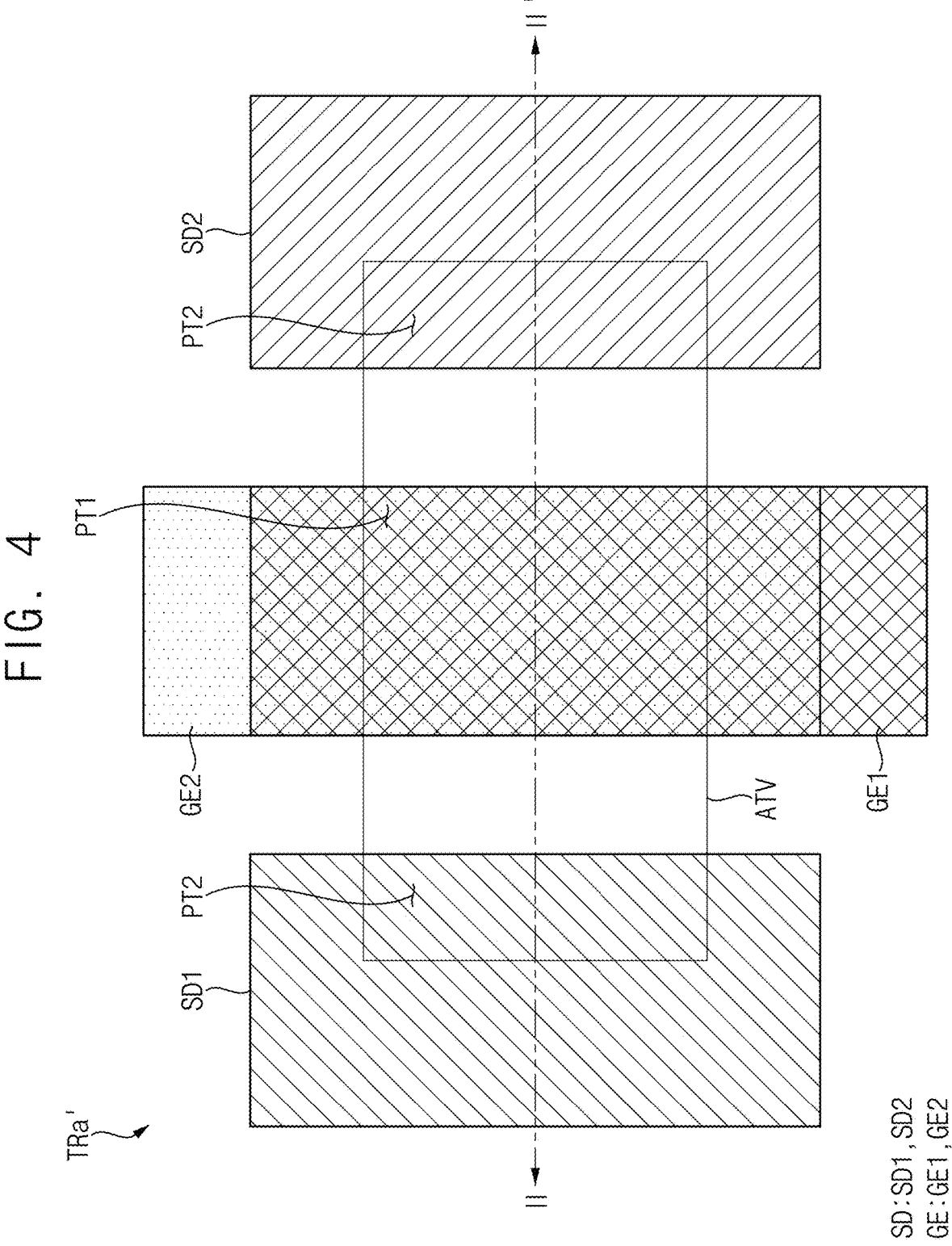
F I G. 4

FIG. 5

SD:SD1,SD2
GE:GE1,GE2
ATV:CL1,SCL,CL2
GI:GI1,GI2

SD′ : SD1′ , SD2′
ATV′ : ATV1 , ATV2 , ATV3 , ATV4 , ATV5 , ATV6 , ATV7 , ATV8 , ATV9 , ATV10

FIG. 8

SD':SD1',SD2'
ATV6:CL1',SCL',CL2'

F I G. 9
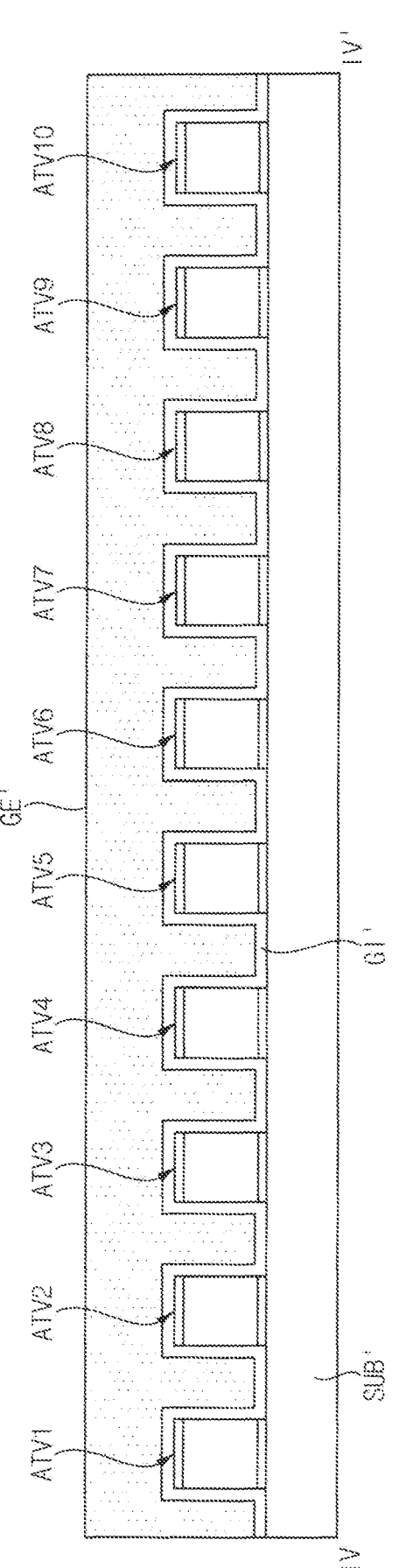
ATV': ATV1, ATV2, ATV3, ATV4, ATV5, ATV6, ATV7, ATV8, ATV9, ATV10

F I G. 10
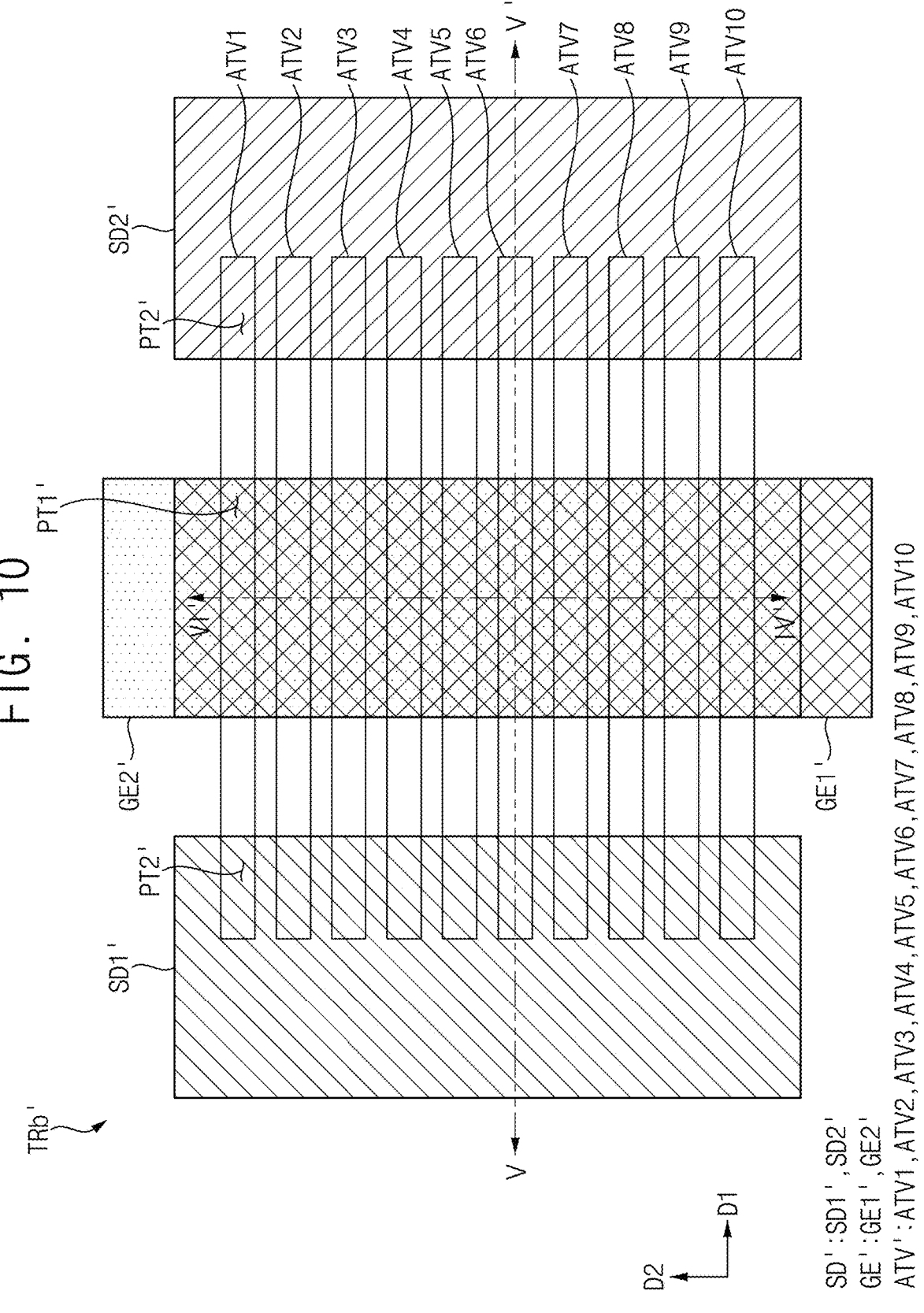
SD' : SD1', SD2'
GE' : GE1', GE2'
ATV' : ATV1, ATV2, ATV3, ATV4, ATV5, ATV6, ATV7, ATV8, ATV9, ATV10

SD':SD1',SD2'
GE';:GE1',GE2'
ATV6':CL1,SCL',CL2'
GI':GI1',GI2'

GE' : GE1' , GE2'
ATV' : ATV1 , ATV2 , ATV3 , ATV4 , ATV5 , ATV6 , ATV7 , ATV8 , ATV9 , ATV10

FIG. 14

| Characteristic / Transistor | On current ($\mu$A) | Mobility ($cm^2$/Vs) | $V_{TH}$ (V) |
|---|---|---|---|
| C1 | 1.5 | 15 | −0.4 |
| C2 | 2.2 | 30 | 0.6 |
| C3 | 2.5 | 30 | 0.1 |
| E1 | 5 | 52 | −3.73 |
| E2 | 11 | 119 | −2.54 |
| E3 | 13 | 134 | −2.79 |

F I G. 15
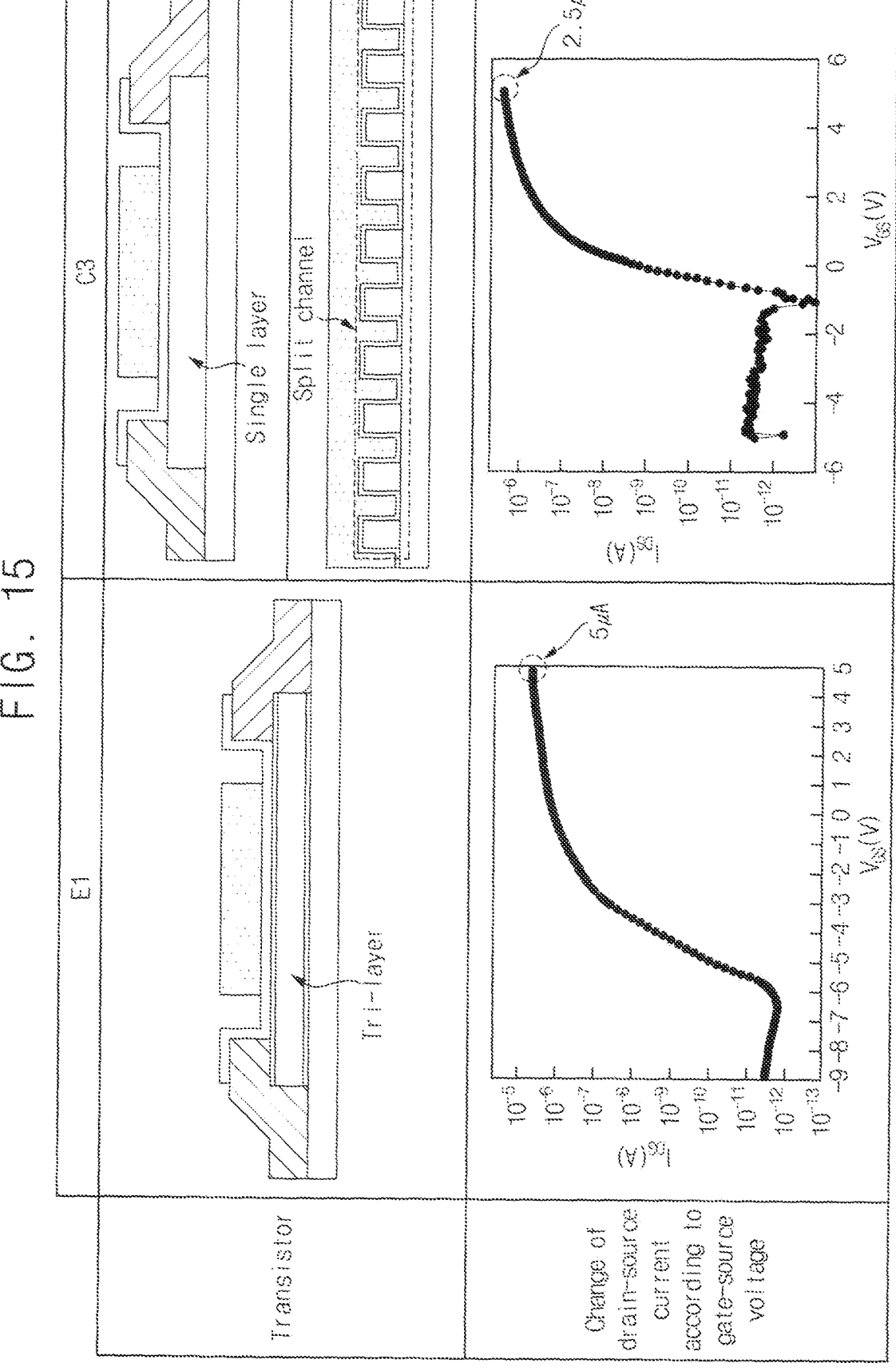

TRANSISTOR

CROSS-REFERENCE TO RELATED APPLICATION

This application claims priority under 35 USC § 119 to Korean Patent Application No. 10-2022-0082831 filed on Jul. 6, 2022, in the Korean Intellectual Property Office (KIPO), the entire disclosure of which is incorporated herein by reference.

BACKGROUND

1. Field

The present disclosure relates to a thin film transistor for a display device.

2. Description of the Related Art

A display device refers to a device for visually displaying data. In order to display an image, the display device may include a plurality of pixels receiving electrical signals to emit light.

Each of the pixels may include a pixel circuit and a light emitting device electrically connected to the pixel circuit (for example, an organic light emitting diode (OLED)). In this case, the pixel circuit may include at least one transistor.

SUMMARY

The present disclosure may provide a transistor having increased carrier mobility.

A transistor according to an embodiment of the present disclosure includes: an active layer including a first conductor layer including metal atoms, a layer of semiconductor material disposed above the first conductor layer, and a second conductor layer disposed above the semiconductor material layer and including the metal atoms; and a gate electrode overlapping with a part of the active layer and electrically insulated from the active layer.

In an embodiment, the semiconductor material layer may include an oxide semiconductor material.

In an embodiment, the semiconductor material layer may be a single layer.

In an embodiment, each of the first conductor layer and the second conductor layer may further include oxygen atoms.

In an embodiment, each of the first conductor layer and the second conductor layer may include at least one of indium tin oxide (ITO) and indium zinc oxide (IZO).

In an embodiment, a thickness of the semiconductor material layer may be greater than a sum of a thickness of the first conductor layer and a thickness of the second conductor layer.

In an embodiment, the thickness of the first conductor layer may be 0.1 nm or more and 5 nm or less, and the thickness of the second conductor layer may be 0.1 nm or more and 5 nm or less.

In an embodiment, the gate electrode may include: a first gate electrode disposed below the active layer and overlapping with the part of the active layer; and a second gate electrode disposed above the active layer and overlapping with the part of the active layer.

In an embodiment, the transistor may include: a first gate insulating layer disposed between the first gate electrode and the active layer, and electrically insulating the first gate electrode from the active layer; and a second gate insulating layer disposed between the second gate electrode and the active layer, and electrically insulating the second gate electrode from the active layer.

A transistor according to another embodiment of the present disclosure includes: a plurality of active layers each including a first conductor layer including metal atoms, a layer of semiconductor material disposed above the first conductor layer, and a second conductor layer disposed above the semiconductor material layer and including the metal atoms, and arranged in a first direction while being spaced apart from each other in a second direction at a right angle to the first direction; and a gate electrode overlapping with a part of each of the active layers and electrically insulated from the active layers.

In an embodiment, the semiconductor material layer may include an oxide semiconductor material.

In an embodiment, the semiconductor material layer may be a single layer.

In an embodiment, each of the first conductor layer and the second conductor layer may further include oxygen atoms.

In an embodiment, each of the first conductor layer and the second conductor layer may include at least one of indium tin oxide (ITO) and indium zinc oxide (IZO).

In an embodiment, a thickness of the semiconductor material layer may be greater than a sum of a thickness of the first conductor layer and a thickness of the second conductor layer.

In an embodiment, the thickness of the first conductor layer may be 0.1 nm or more and 5 nm or less, and the thickness of the second conductor layer may be 0.1 nm or more and 5 nm or less.

In an embodiment, the gate electrode may cover at least side surfaces of each of the active layers spaced apart from each other.

In an embodiment, the gate electrode may include: a first gate electrode disposed below the active layers and overlapping with the part of each of the active layers; and a second gate electrode disposed above the active layers and overlapping with the part of each of the active layers.

In an embodiment, The second gate electrode may cover at least side surfaces of each of the active layers spaced apart from each other.

In an embodiment, the transistor may include: a first gate insulating layer disposed between the first gate electrode and the active layers and electrically insulating the first gate electrode from the active layer; and a second gate insulating layer disposed between the second gate electrode and the active layer, and electrically insulating the second gate electrode from the active layer.

The transistor according to an embodiment of the present disclosure may include an active layer including a first conductor layer, a layer of semiconductor material disposed above the first conductor layer, and a second conductor layer disposed above the semiconductor material layer. Accordingly, the transistor can have improved carrier mobility.

The transistor according to another embodiment of the present disclosure may include a plurality of active layers each including a first conductor layer, a layer of semiconductor material disposed above the first conductor layer, and a second conductor layer disposed above the semiconductor material layer. Accordingly, the transistor can have improved carrier mobility.

However, the effect according to the present disclosure is not limited to the above-described effect, and may be variously expanded without departing from the idea and scope of the present disclosure.

BRIEF DESCRIPTION OF THE DRAWINGS

FIG. 1 is a plan view of a transistor according to a first embodiment of the present disclosure.

FIG. 4 is a plan view of a transistor according to a second embodiment of the present disclosure.

FIG. 5 is a sectional view taken along line II-II' of FIG. 4.

FIG. 8 is a sectional view taken along line III-III' of FIG. 7.

FIG. 9 is a sectional view taken along line IV-IV' of FIG. 7.

FIG. 10 is a plan view of a transistor according to a fourth embodiment of the present disclosure.

FIGS. 14 and 15 are views for explaining device characteristics of the transistor according to the embodiments of the present disclosure.

DETAILED DESCRIPTION OF THE EMBODIMENTS

Figure 2:
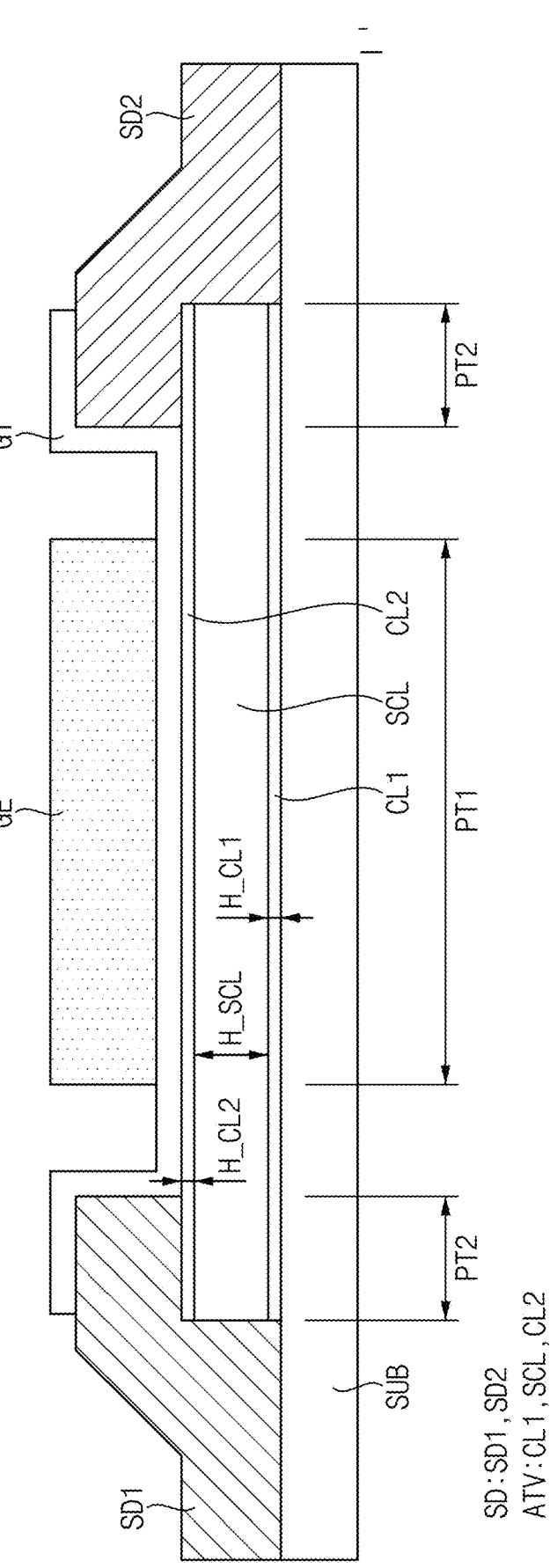
FIG. 2 is a sectional view taken along line I-I of FIG. 1.

Hereinafter, a transistor according to the embodiments of the present disclosure will be described in more detail with reference to the accompanying drawings. The same or similar reference numerals are used for the same components in the accompanying drawings.

FIG. 1 is a plan view of a transistor according to the first embodiment of the present disclosure.

Referring to FIG. 1, a transistor TRa according to the first embodiment of the present disclosure may include an active layer ATV, a gate electrode GE and a source-drain electrode SD. In this case, the source-drain electrode SD may include a first source-drain electrode SD1 and a second source-drain electrode SD2.

As described later with reference to FIG. 2, the active layer ATV may have a structure of conductor/semiconductor/conductor. In other words, the active layer ATV may have a triple layer (tri-layer) structure of conductor/semiconductor/conductor.

The gate electrode GE may overlap with a part PT1 of the active layer ATV when viewed in a plan view, and may be electrically insulated from the active layer ATV. The gate electrode GE may adjust electrical conductivity of the active layer ATV. For example, when a voltage at a predetermined level or higher is applied to the gate electrode GE, the active layer ATV may have electrical conductivity, and when a voltage lower than the predetermined level is applied to the gate electrode GE, the active layer ATV may not substantially have electrical conductivity.

The source-drain electrode SD may overlap the active layer ATV when viewed in the plan view. In this case, the source-drain electrode SD may electrically come into contact with the active layer ATV.

FIG. 2 is a sectional view taken along line I-I' of FIG. 1. FIG. 2 shows the embodiment in which the gate electrode GE is disposed above the active layer ATV, however, the present disclosure is not limited thereto. For example, the gate electrode GE may be disposed below the active layer ATV.

Referring to FIG. 2, a transistor TRa may include a substrate SUB, an active layer ATV, a source-drain electrode SD, a gate insulating layer GI and a gate electrode GE.

The substrate SUB may include glass, ceramic or metal. Alternatively, the substrate SUB may include a material having flexible characteristics.

Although not shown in the drawings, a buffer layer may be further disposed above the substrate SUB. The buffer layer may reduce or block foreign matter, moisture, or outside air from the substrate SUB. In addition, the buffer layer may provide a flat surface on the substrate SUB. The buffer layer may include an insulating material.

The active layer ATV may be disposed above the substrate SUB. When the buffer layer is further disposed above the substrate SUB, the active layer ATV may be disposed above the buffer layer. the active layer ATV may include a first conductor layer CL1, a semiconductor material layer SCL, and a second conductor layer CL2.

The first conductor layer CL1 may be disposed above the substrate SUB, and the second conductor layer CL2 may be disposed above the first conductor layer CL1. Each of the first conductor layer CL1 and the second conductor layer CL2 may include metal atoms. For example, each of the first conductor layer CL1 and the second conductor layer CL2 may include aluminum, platinum, palladium, silver, magnesium, gold, nickel, neodymium, iridium, chromium, lithium, calcium, molybdenum, titanium, tungsten, copper, niobium, and the like.

In an embodiment, each of the first conductor layer CL1 and the second conductor layer CL2 may further include oxygen atoms. For example, each of the first conductor layer CL1 and the second conductor layer CL2 may include indium tin oxide (ITO) or indium zinc oxide (IZO).

The semiconductor material layer SCL may be disposed between the first conductor layer CL1 and the second conductor layer CL2. The semiconductor material layer SCL may include an oxide semiconductor material. For example, the semiconductor material layer SCL may be an InSnGaZnO (ITGZO) semiconductor material, an InSnZnO (ITZO) semiconductor material, or a ZnO semiconductor material. In an embodiment, the semiconductor material layer SCL may have a single layer structure including any one of the above-described materials.

The gate insulating layer GI may be disposed above the active layer ATV. The gate insulating layer GI may electrically insulate the gate electrode GE from the active layer ATV. The gate insulating layer GI may include an insulating material.

The gate electrode GE may be disposed above the gate insulating layer GI. The gate electrode GE may overlap with the part PT1 of the active layer ATV. In this case, the part of the active layer ATV may be referred to as a channel area. The gate electrode GE may include a conductive material.

The source-drain electrode SD may be disposed above the substrate SUB. The source-drain electrode SD may overlap with an other part PT2 of the active layer ATV. Specifically, each of the first source-drain electrode SD1 and the second source-drain electrode SD2 may overlap with the other part PT2 of the active layer ATV. In addition, the source-drain electrode SD may electrically come into contact with the active layer ATV, and may be electrically insulated from the gate electrode GE. In this case, in the active layer ATV, the area electrically coming into contact with the source-drain electrode SD may be referred to as a source area and a drain area. In an embodiment, as shown in FIG. 2, the channel area may be positioned between the source area and the drain area.

The gate electrode GE, the first conductor layer CL1 and the second conductor layer CL2 may adjust electrical conductivity of the semiconductor material layer SCL. For example, in the case that the transistor TRa is an N-MOS transistor, and when a voltage at a threshold voltage or higher is applied to the gate electrode GE, electrons of the semiconductor material layer SCL may be condensed in the channel area, so that a channel may be formed. Accordingly, the semiconductor material layer SCL may have electrical conductivity, and current may flow between the first source-drain electrode SD1 and the second source-drain electrode SD2 through the channel.

In this case, the first conductor layer CL1 and the second conductor layer CL2 may induce the formation of the channel in the semiconductor material layer SCL. For example, the first conductor layer CL1 may induce the formation of the channel in a lower part of the semiconductor material layer SCL adjacent to the first conductor layer CL1, and the second conductor layer CL2 may induce the formation of the channel in an upper part of the semiconductor material layer SCL adjacent to the second conductor layer CL2. Accordingly, the first conductor layer CL1 and the second conductor layer CL2 may improve carrier mobility of the semiconductor material layer SCL.

A thickness H_CL1 of the first conductor layer CL1 and a thickness H_CL2 of the second conductor layer CL2 may be relatively small. For example, the sum of the thickness H_CL1 of the first conductor layer CL1 and the thickness H_CL2 of the second conductor layer CL2 may be smaller than a thickness H_SCL of the semiconductor material layer SCL. When the thickness H_CL1 of the first conductor layer CL1 and the thickness H_CL2 of the second conductor layer CL2 are relatively large, current may flow between the first source-drain electrode SD1 and the second source-drain electrode SD2 through the first conductor layer CL1 and the second conductor layer CL2, regardless of the voltage applied to the gate electrode GE.

In an embodiment, each of the thickness H_CL1 of the first conductor layer CL1 and the thickness H_CL2 of the second conductor layer CL2 may be greater than or equal to about 0.1 nm and less than or equal to about 5 nm. Preferably, each of the thickness H_CL1 of the first conductor layer CL1 and the thickness H_CL2 of the second conductor layer CL2 may be greater than or equal to about 1.5 nm and less than or equal to about 3 nm. When each of the thickness H_CL1 of the first conductor layer CL1 and the thickness H_CL2 of the second conductor layer CL2 is less than about 0.1 nm, the first conductor layer CL1 and the second conductor layer CL2 may not substantially induce the formation of the channel in the semiconductor material layer SCL. In addition, when each of the thickness H_CL1 of the first conductor layer CL1 and the thickness H_CL2 of the second conductor layer CL2 is greater than about 5 nm, current may flow between the first source-drain electrode SD1 and the second source-drain electrode SD2 through the first conductor layer CL1 and the second conductor layer CL2, regardless of the voltage applied to the gate electrode GE.

Figure 3:
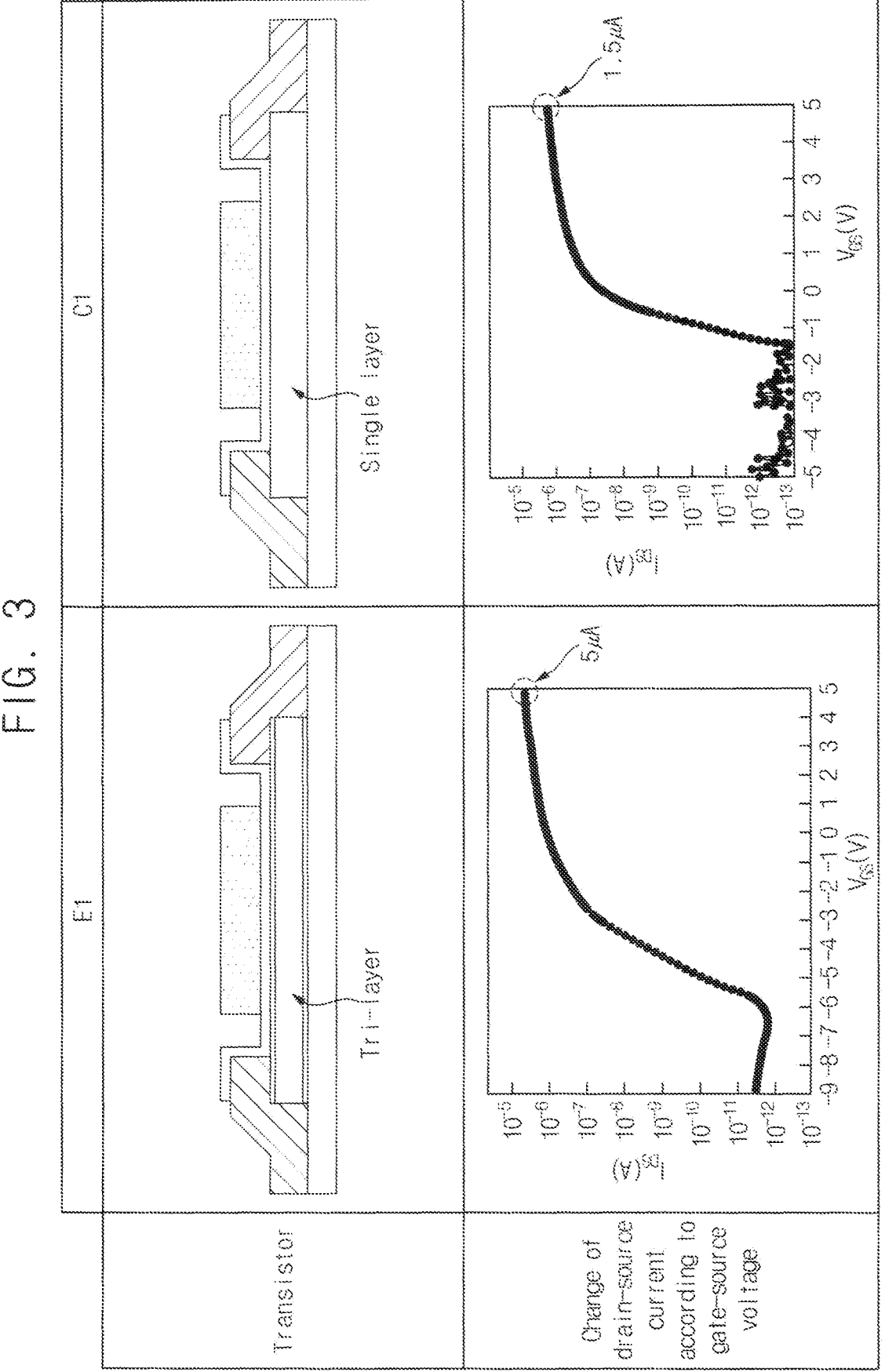
FIG. 3 is a view for explaining device characteristics of the transistor shown in FIGS. 1 and 2.

FIG. 3 is a view for explaining device characteristics of the transistor shown in FIGS. 1 and 2.

Referring to FIG. 3, FIG. 3 is a table comparing characteristics of the gate-source voltage VGS and drain-source current IDS of the transistor according to the first experimental example E1, with characteristics of the gate-source voltage VGS and drain-source current IDS of the transistor according to the first comparative example C1.

The transistor according to the first experimental example E1 has substantially the same structure as the transistor TRa according to the first embodiment of the present disclosure described with reference to FIGS. 1 and 2. More specifically, the transistor according to the first experimental example E1 includes an active layer having a tri-layer structure of ITO conductor layer/ITGZO semiconductor material layer/ITO conductor layer, the sectional thickness of each of the ITO conductor layers is about 4 nm, and the sectional thickness of the ITGZO semiconductor material layer is about 45 nm. In addition, the horizontal length of the active layer when viewed in the plan view is about 100 μm, and the vertical length of the active layer when viewed in the plan view is about 50 μm.

The transistor according to the first comparative example C1 has substantially the same structure as the above transistor according to the first experimental example E1, except that the active layer has a single-layer structure of the ITGZO semiconductor material layer. More specifically, the transistor according to the first comparative example C1 includes an active layer having a single layer structure of an ITGZO semiconductor material layer, and the sectional thickness of the ITGZO semiconductor material layer is about 45 nm.

When the gate-source voltage VGS of the transistor according to the first experimental example E1 is about 5V, the drain-to-source current IDS of the transistor according to the first experimental example E1 is about 5 μA. In addition, When the gate-source voltage VGS of the transistor according to the first comparative example C1 is about 5V, the drain-to-source current IDS of the transistor according to the first comparative example C1 is about 1.5 μA. In other words, when a turn-on voltage of the same level (for example, a voltage of 5V) is applied to the gate electrode, a transistor including an active layer having a tri-layer structure of conductor layer/semiconductor material layer/conductor layer (for example, the transistor according to the first experimental example E1) may have improved carrier mobility, compared to a transistor including an active layer having a single layer structure of a semiconductor material layer (for example, the transistor according to comparative example C1).

FIG. 4 is a plan view of a transistor according to a second embodiment of the present disclosure.

Referring to FIG. 4, the transistor TRa' according to the second embodiment of the present disclosure may include an active layer ATV, a gate electrode GE and a source-drain electrode SD. In this case, the gate electrode GE may include a first gate electrode GE1 and a second gate electrode GE2, and the source-drain electrode SD may include a first source-drain electrode SD1 and a second source-drain electrode SD2.

The active layer ATV may be substantially the same as the active layer ATV described with reference to FIGS. 1 and 2. In other words, the active layer ATV may have a tri-layer structure of conductor/semiconductor/conductor.

Each of the first gate electrode GE1 and the second gate electrode GE2 may overlap with a part PT1 of the active layer ATV when viewed in a plan view. The first gate electrode GE1 and the second gate electrode GE2 may adjust electrical conductivity of the active layer ATV.

In an embodiment, the first gate electrode GE1 may be a bottom gate electrode disposed below the active layer ATV, and the second gate electrode GE2 may be a top gate electrode disposed above the active layer ATV. In other words, the transistor TRa' may be a dual gate transistor including a top gate electrode and a bottom gate electrode.

The source-drain electrode SD may be substantially the same as the source-drain electrode SD described with reference to FIGS. 1 and 2. In other words, the source-drain electrode SD may overlap with an other part PT2 of the active layer ATV when viewed in the plan view, and may electrically come into contact with the active layer ATV.

Figure 5:
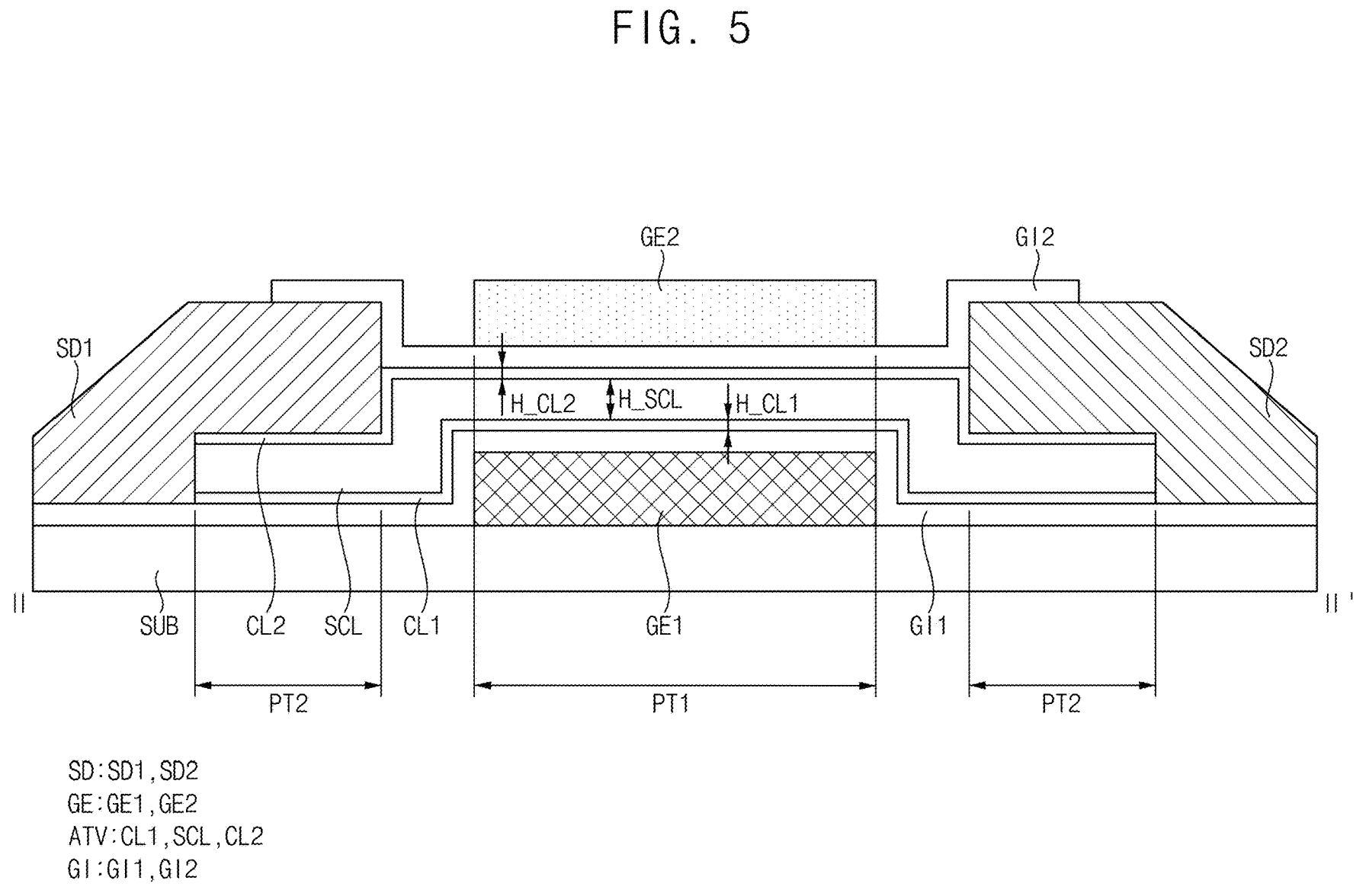

FIG. 5 is a sectional view taken along line II-II' of FIG. 4.

Referring to FIG. 5, the transistor TRa' may include a substrate SUB, an active layer ATV, a source-drain electrode SD, a gate insulating layer GI and a gate electrode GE. In this case, the gate insulating layer GI may include a first gate insulating layer GI1 and a second gate insulating layer GI2.

The substrate SUB may be substantially the same as the substrate SUB described with reference to FIG. 2. Although not shown in the drawings, a buffer layer may be further disposed above the substrate SUB.

The first gate electrode GE1 may be disposed above the substrate SUB. When the buffer layer is further disposed above the substrate SUB, the first gate electrode GE1 may be disposed above the buffer layer. The first gate electrode GE1 may include a conductive material.

The first gate insulating layer GI1 may be disposed above the substrate SUB, and may cover the first gate electrode GE1. The first gate insulating layer GI1 may electrically insulate the first gate electrode GE1 from the active layer ATV. The first gate insulating layer GI1 may include an insulating material.

The active layer ATV may be disposed above the first gate insulating layer GI1. The active layer ATV may be substantially the same as the active layer ATV described with reference to FIG. 2. In other words, the active layer ATV may include a first conductor layer CL1, a semiconductor material layer SCL, and a second conductor layer CL2.

The second gate insulating layer GI2 may be disposed above the active layer ATV. The second gate insulating layer GI2 may electrically insulate the active layer ATV from the second gate electrode GE2. The second gate insulating layer GI2 may include an insulating material.

The second gate electrode GE2 may be disposed above the second gate insulating layer GI2. The second gate electrode GE2 may include a conductive material.

Each of the first gate electrode GE1 and the second gate electrode GE2 may overlap with the part PT1 of the active layer ATV. In this case, the part of the active layer ATV may be referred to as a channel area.

The source-drain electrode SD may be disposed above the substrate SUB. The source-drain electrode SD may be substantially the same as the source-drain electrode SD described with reference to FIG. 2. In other words, the source-drain electrode SD may overlap with the other part PT2 of the active layer ATV, and may electrically come into contact with the active layer ATV. In this case, in the active layer ATV, the area electrically coming into contact with the source-drain electrode SD may be referred to as a source area and a drain area.

The gate electrode GE, the first conductor layer CL1 and the second conductor layer CL2 may adjust electrical conductivity of the semiconductor material layer SCL. For example, in the case that the transistor TRa' is an N-MOS transistor, and when a voltage at a threshold voltage or higher is applied to the gate electrode GE, electrons of the semiconductor material layer SCL may be condensed in the channel area, so that a channel may be formed. Accordingly, the semiconductor material layer SCL may have electrical conductivity, and current may flow between the first source-drain electrode SD1 and the second source-drain electrode SD2 through the channel.

In this case, the first conductor layer CL1 and the second conductor layer CL2 may induce the formation of the channel in the semiconductor material layer SCL. Accordingly, the first conductor layer CL1 and the second conductor layer CL2 may improve carrier mobility of the semiconductor material layer SCL.

A thickness H_CL1 of the first conductor layer CL1 and a thickness H_CL2 of the second conductor layer CL2 may be relatively small. For example, the sum of the thickness H_CL1 of the first conductor layer CL1 and the thickness H_CL2 of the second conductor layer CL2 may be smaller than a thickness H_SCL of the semiconductor material layer SCL. When the thickness H_CL1 of the first conductor layer CL1 and the thickness H_CL2 of the second conductor layer CL2 are relatively large, current may flow between the first source-drain electrode SD1 and the second source-drain electrode SD2 through the first conductor layer CL1 and the second conductor layer CL2, regardless of the voltage applied to the gate electrode GE.

In an embodiment, each of the thickness H_CL1 of the first conductor layer CL1 and the thickness H_CL2 of the second conductor layer CL2 may be greater than or equal to about 0.1 nm and less than or equal to about 5 nm. Preferably, each of the thickness H_CL1 of the first conductor layer CL1 and the thickness H_CL2 of the second conductor layer CL2 may be greater than or equal to about 1.5 nm and less than or equal to about 3 nm. When each of the thickness H_CL1 of the first conductor layer CL1 and the thickness H_CL2 of the second conductor layer CL2 is less than about 0.1 nm, the first conductor layer CL1 and the second conductor layer CL2 may not substantially induce the formation of the channel in the semiconductor material layer SCL. In addition, when each of the thickness H_CL1 of the first conductor layer CL1 and the thickness H_CL2 of the second conductor layer CL2 is greater than about 5 nm, current may flow between the first source-drain electrode SD1 and the second source-drain electrode SD2 through the first conductor layer CL1 and the second conductor layer CL2, regardless of the voltage applied to the gate electrode GE.

Figure 6:
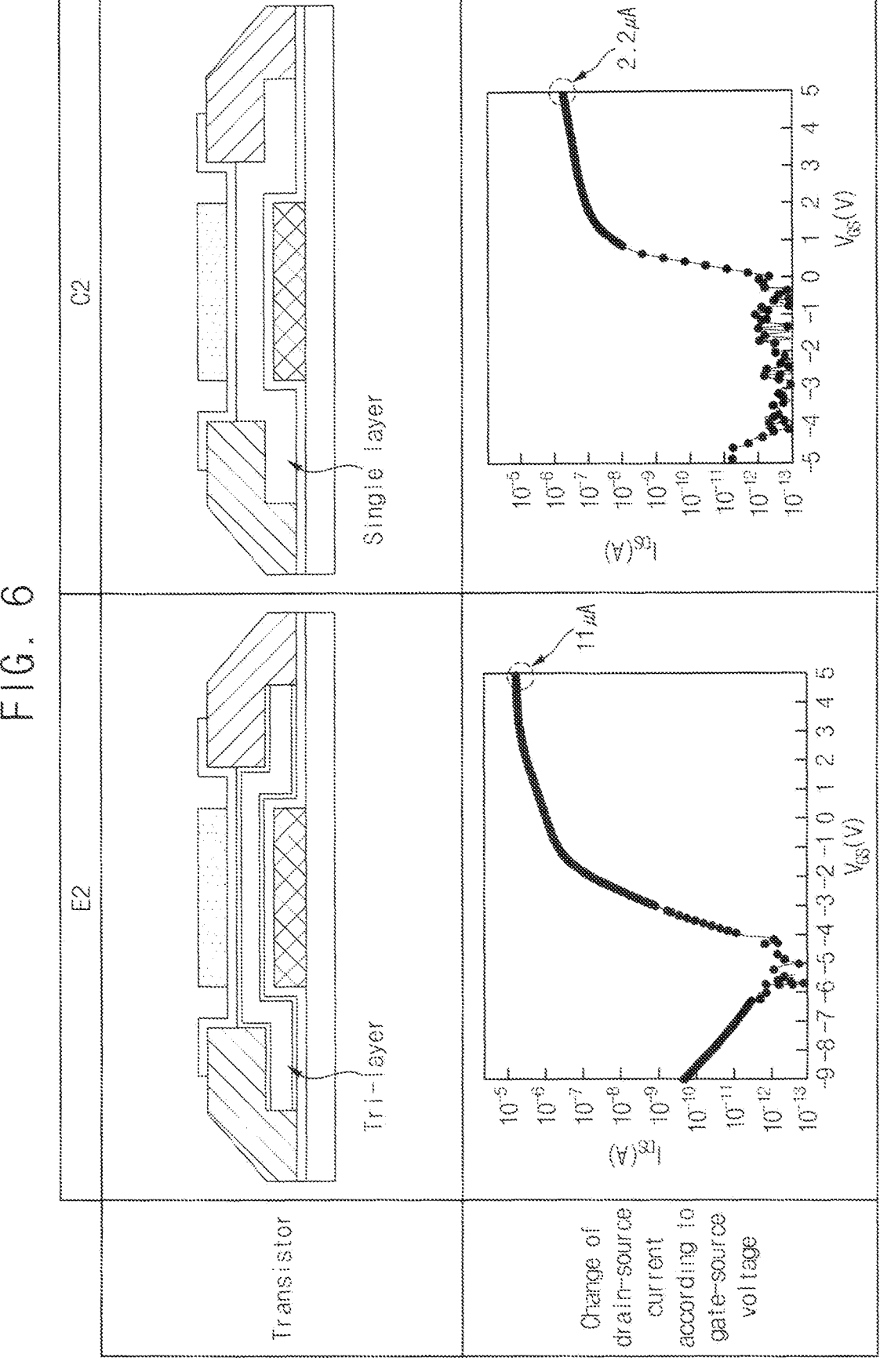
FIG. 6 is a view for explaining device characteristics of the transistor shown in FIGS. 4 and 5.

FIG. 6 is a view for explaining device characteristics of the transistor shown in FIGS. 4 and 5.

Referring to FIG. 6, FIG. 6 is a table comparing characteristics of the gate-source voltage VGS and drain-source current IDS of the transistor according to the second experimental example E2, with characteristics of the gate-source voltage VGS and drain-source current IDS of the transistor according to the second comparative example C2.

The transistor according to the second experimental example E2 has substantially the same structure as the transistor TRa' according to the second embodiment of the present disclosure described with reference to FIGS. 4 and 5. More specifically, the transistor according to the second experimental example E2 includes an active layer having a tri-layer structure of ITO conductor layer/ITGZO semiconductor material layer/ITO conductor layer, the sectional thickness of each of the ITO conductor layers is about 4 nm, and the sectional thickness of the ITGZO semiconductor material layer is about 45 nm. In this case, the horizontal length of the active layer when viewed in the plan view is about 100 μm, and the vertical length of the active layer when viewed in the plan view is about 50 μm. In addition, the transistor according to the second experimental example E2 is a dual gate transistor including a top gate electrode and a bottom gate electrode.

The transistor according to the second comparative example C2 has substantially the same structure as the above transistor according to the second experimental example E2, except that the active layer has a single-layer structure of the ITGZO semiconductor material layer. More specifically, the transistor according to the second comparative example C2 includes an active layer having a single layer structure of an ITGZO semiconductor material layer, and the sectional thickness of the ITGZO semiconductor material layer is about 45 nm. In addition, the transistor according to the second comparative example C2 is a dual gate transistor including a top gate electrode and a bottom gate electrode.

When the gate-source voltage VGS of the transistor according to the second experimental example E2 is about 5V, the drain-to-source current IDS of the transistor according to the second experimental example E2 is about 11 μA. In addition, when the gate-source voltage VGS of the transistor according to the second comparative example C2 is about 5V, the drain-to-source current IDS of the transistor according to the second comparative example C2 is about 2.2 μA. In other words, when a turn-on voltage of the same level (for example, a voltage of 5V) is applied to the gate electrode, a dual gate transistor including an active layer having a tri-layer structure of conductor layer/semiconductor material layer/conductor layer (for example, the transistor according to the second experimental example E2) may have improved carrier mobility, compared to a dual gate transistor including an active layer having a single layer structure of a semiconductor material layer (for example, the transistor according to the second comparative example C2).

Figure 7:
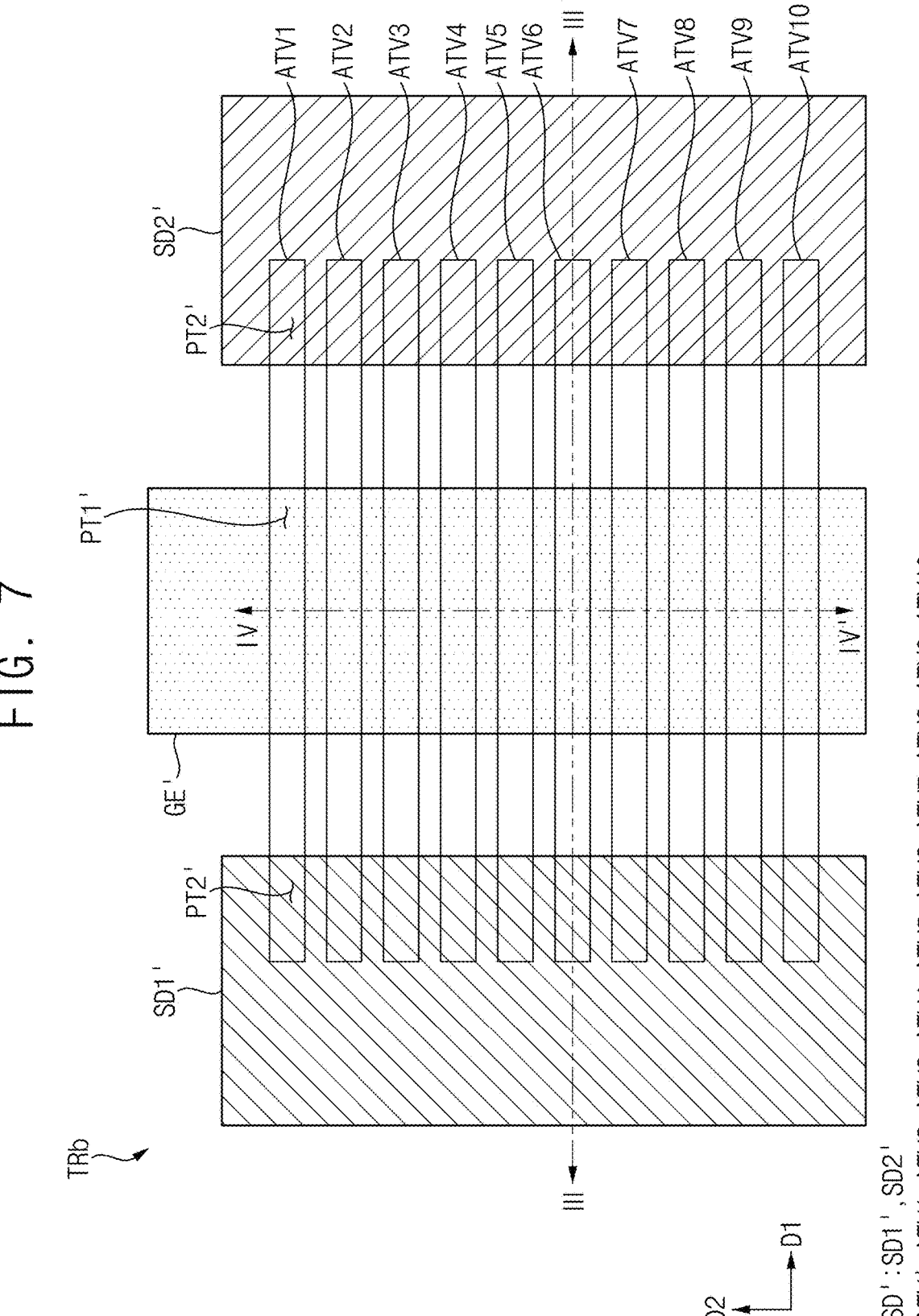
FIG. 7 is a plan view of a transistor according to a third embodiment of the present disclosure.

FIG. 7 is a plan view of a transistor according to a third embodiment of the present disclosure.

Referring to FIG. 7, the transistor TRb according to the third embodiment of the present disclosure may include a plurality of active layers ATV, a gate electrode GE' and a source-drain electrode SD'. In this case, the source-drain electrode SD' may include a first source-drain electrode SD1' and a second source-drain electrode SD2'.

Each of the active layers ATV, as described later with reference to FIG. 8, may have a structure of conductor/semiconductor/conductor. In other words, each of the active layers ATV' may have a tri-layer structure of conductor/semiconductor/conductor.

In an embodiment, the active layers ATV' may include first to tenth active layers ATV1, ATV2, ATV3, ATV4, ATV5, ATV6, ATV7, ATV8, ATV9, and ATV10. Each of the first to tenth active layers ATV1, ATV2, ATV3, ATV4, ATV5, ATV6, ATV7, ATV8, ATV9, and ATV10 may extend in one direction D1, and may be arranged in another direction D2 intersecting the one direction D1. However, the present disclosure is not limited thereto, and the active layers ATV' may include first to n-th active layers (n is a natural number greater than or equal to 2).

The gate electrode GE' may overlap with a part PT1' of each of the active layers ATV' when viewed in a plan view, and may be electrically insulated from each of the active layers ATV'. The gate electrode GE' may adjust electrical conductivity of each of the active layers ATV'. For example, when a voltage at a predetermined level or higher is applied to the gate electrode GE', each of the active layers ATV' may have electrical conductivity, and when a voltage lower than the predetermined level is applied to the gate electrode GE', each of the active layers ATV' may not substantially have electrical conductivity.

The source-drain electrode SD' may overlap with an other part PT2' of each of the active layers ATV' when viewed in the plan view. In this case, the source-drain electrode SD' may electrically come into contact with each of the active layers ATV'.

Figure 8:
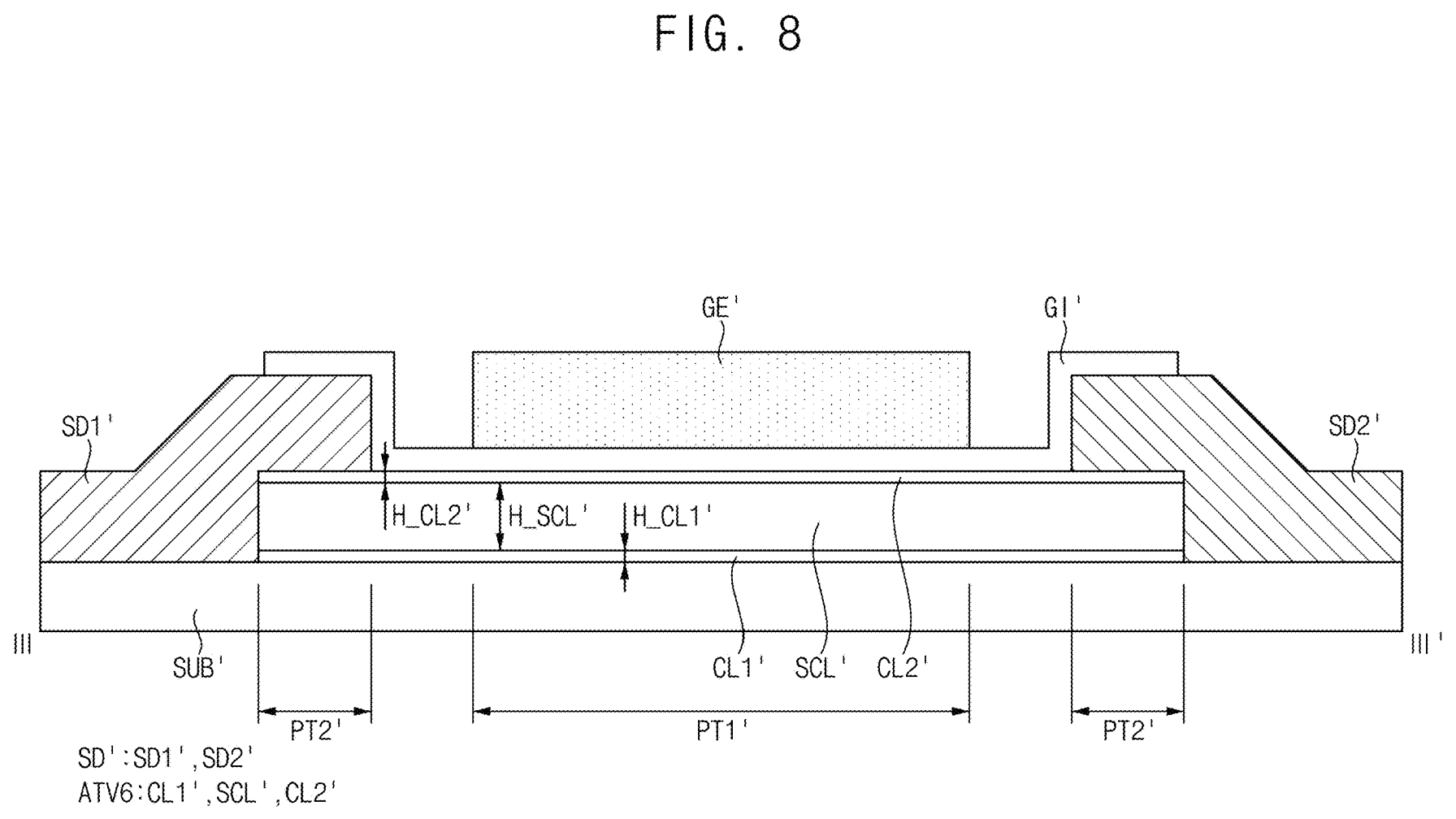

FIG. 8 is a sectional view taken along line III-III' of FIG. 7. For convenience of description, FIG. 8 shows only the sixth active layer ATV6, and each of the active layers ATV not shown in FIG. 8 may have substantially the same structure as the sixth active layer ATV6. In addition, FIG. 8 shows the embodiment in which the gate electrode GE' is disposed above the sixth active layer ATV6, however, the present disclosure is not limited thereto. For example, the gate electrode GE' may be disposed below the sixth active layer ATV6.

Referring to FIG. 8, the transistor TRb may include a substrate SUB', a sixth active layer ATV6, a source-drain electrode SD', a gate insulating layer GI' and a gate electrode GE'.

The substrate SUB' may be substantially the same as the substrate SUB described with reference to FIG. 2. Although not shown in the drawings, a buffer layer may be further disposed above the substrate SUB'.

The sixth active layer ATV6 may be disposed above the substrate SUB'. When the buffer layer is further disposed above the substrate SUB', the sixth active layer ATV6 may be disposed above the buffer layer. The sixth active layer ATV6 may include a first conductor layer CL1, a semiconductor material layer SCL', and a second conductor layer CL2'.

The first conductor layer CL1 may be disposed above the substrate SUB', and the second conductor layer CL2' may be disposed above the first conductor layer CL1. Each of the first conductor layer CL1 and the second conductor layer CL2' may include metal atoms such as aluminum, platinum, palladium, silver, magnesium, gold, nickel, neodymium, iridium, chromium, lithium, calcium, molybdenum, titanium, tungsten, copper, and niobium.

In an embodiment, each of the first conductor layer CL1 and the second conductor layer CL2' may further include oxygen atoms. For example, each of the first conductor layer CL1 and the second conductor layer CL2' may include indium tin oxide (ITO) or indium zinc oxide (IZO).

The semiconductor material layer SCL' may be disposed between the first conductor layer CL1 and the second conductor layer CL2'. The semiconductor material layer SCL' may include an oxide semiconductor material. For example, the semiconductor material layer SCL may be an InSnGaZnO (ITGZO) semiconductor material, an InSnZnO (ITZO) semiconductor material, or a ZnO semiconductor material. In an embodiment, the semiconductor material layer SCL' may have a single layer structure including any one of the above-described materials.

The gate insulating layer GI' may be disposed above the sixth active layer ATV6. The gate insulating layer GI may electrically insulate the gate electrode GE from each of the active layers ATV. For example, the gate insulating layer GI' may electrically insulate the gate electrode GE from the sixth active layer ATV6. The gate insulating layer GI' may include an insulating material.

The gate electrode GE' may be disposed above the gate insulating layer GI'. The gate electrode GE' may overlap with the part PT1' of each of the active layers ATV'. For example, as shown in FIG. 8, the gate electrode GE' may overlap with a part of the sixth active layer ATV'. In this case, the part of the sixth active layer ATV' may be referred to as a channel area. The gate electrode GE' may include a conductive material.

The source-drain electrode SD' may be disposed above the substrate SUB'. The source-drain electrode SD' may overlap with the other part PT2' of each of the active layers ATV'. For example, as shown in FIG. 8, each of the first source-drain electrode SD1' and the second source-drain electrode SD2' may overlap with other part of the sixth active layer ATV6. In addition, the source-drain electrode SD may electrically come into contact with each of the active layers ATV', and may be electrically insulated from the gate electrode GE'. For example, as shown in FIG. 8, each of the first source-drain electrode SD1' and the second source-drain electrode SD2' may electrically come into contact with the sixth active layer ATV6. In this case, in the sixth active layer ATV6, the area electrically coming into contact with the source-drain electrode SD' may be referred to as a source area and a drain area. In an embodiment, as shown in FIG. 8, the channel area may be positioned between the source area and the drain area.

The gate electrode GE', the first conductor layer CL1 and the second conductor layer CL2' may adjust electrical conductivity of the semiconductor material layer SCL'. For example, in the case that the transistor TRb is an N-MOS transistor, and when a voltage at a threshold voltage or higher is applied to the gate electrode GE', electrons of the semiconductor material layer SCL' may be condensed in the channel area, so that a channel may be formed. Accordingly, the semiconductor material layer SCL' may have electrical conductivity, and current may flow between the first source-drain electrode SD1' and the second source-drain electrode SD2' through the channel.

In this case, the first conductor layer CL1 and the second conductor layer CL2' may induce the formation of the channel in the semiconductor material layer SCL'. For example, the first conductor layer CL1' may induce the formation of the channel in a lower part of the semiconductor material layer SCL' adjacent to the first conductor layer CL1, and the second conductor layer CL2' may induce the formation of the channel in an upper part of the semiconductor material layer SCL' adjacent to the second conductor layer CL2'. Accordingly, the first conductor layer CL1' and the second conductor layer CL2' may improve carrier mobility of the semiconductor material layer SCL'.

A thickness H_CL1' of the first conductor layer CL1 and a thickness H_CL2' of the second conductor layer CL2' may be relatively small. For example, the sum of the thickness H_CL1' of the first conductor layer CL1 and the thickness H_CL2' of the second conductor layer CL2' may be smaller than a thickness H_SCL' of the semiconductor material layer SCL'. When the thickness H_CL1' of the first conductor layer CL1 and the thickness H_CL2' of the second conductor layer CL2' are relatively large, current may flow between the first source-drain electrode SD1' and the second source-drain electrode SD2' through the first conductor layer CL1 and the second conductor layer CL2', regardless of the voltage applied to the gate electrode GE.

In an embodiment, each of the thickness H_CL1' of the first conductor layer CL1 and the thickness H_CL2' of the second conductor layer CL2' may be greater than or equal to about 0.1 nm and less than or equal to about 5 nm. Preferably, each of the thickness H_CL1' of the first conductor layer CL1 and the thickness H_CL2' of the second conductor layer CL2' may be greater than or equal to about 1.5 nm and less than or equal to about 3 nm. When each of the thickness H_CL1' of the first conductor layer CL1 and the thickness H_CL2' of the second conductor layer CL2' is less than about 0.1 nm, the first conductor layer CL1' and the second conductor layer CL2' may not substantially induce the formation of the channel in the semiconductor material layer SCL. In addition, when each of the thickness H_CL1' of the first conductor layer CL1 and the thickness H_CL2' of the second conductor layer CL2' is greater than about 5 nm, current may flow between the first source-drain electrode SD1' and the second source-drain electrode SD2' through the first conductor layer CL1 and the second conductor layer CL2', regardless of the voltage applied to the gate electrode GE.

FIG. 9 is a sectional view taken along line IV-IV' of FIG. 7. Descriptions overlapping with those described in FIG. 8 will be omitted.

Referring to FIG. 9, the transistor TRb may have a split channel structure including a plurality of active layers ATV'. Accordingly, the active layers ATV' may have relatively reduced resistance, so that carrier mobility of the transistor TRb may be improved.

In an embodiment, the gate electrode GE' may cover at least side surfaces of each of the active layers ATV'. In other words, at least a part of the gate electrode GE' may be disposed between two active layers adjacent to each other among the active layers ATV' (for example, between the fifth active layer ATV5 and the sixth active layer ATV6).

Accordingly, in the case that the transistor TRb is an N-MOS transistor, and when a voltage at a threshold voltage or higher is applied to the gate electrode GE', electrons may be further condensed on side surfaces of the semiconductor material layer SCL' included in each of the active layers ATV', so that the channel may be formed. Accordingly, carrier mobility of the transistor TRb may be further improved.

In addition, in the case that the transistor TRb is an N-MOS transistor, and when a voltage less than the threshold voltage is applied to the gate electrode GE', the gate electrode GE' may induce depletion at the side surfaces of the semiconductor material layer SCL' included in each of the active layers ATV'. Accordingly, when the transistor TRb is turned off (for example, when the voltage less than the threshold voltage is applied to the gate electrode GE'), leakage current of the transistor TRb may be relatively reduced.

FIG. 10 is a plan view of a transistor according to a fourth embodiment of the present disclosure.

Referring to FIG. 10, the transistor TRb' according to the fourth embodiment of the present disclosure may include a plurality of active layers ATV, a gate electrode GE' and a source-drain electrode SD'. In this case, the source-drain electrode SD' may include a first source-drain electrode SD1' and a second source-drain electrode SD2', and the gate electrode GE' may include a first gate electrode GE1 and a second gate electrode GE2'.

The active layers ATV may be substantially the same as the active layers ATV as described with reference to FIGS. 7 and 8. In other words, each of the active layers ATV' may have a tri-layer structure of conductor/semiconductor/conductor.

Each of the first gate electrode GE1' and the second gate electrode GE2' may overlap with a part PT1' of each of the active layers ATV' when viewed in a plan view. The first gate electrode GE1' and the second gate electrode GE2' may adjust electrical conductivity of each of the active layers ATV'.

In an embodiment, the first gate electrode GE1 may be a bottom gate electrode disposed below each of the active layers ATV, and the second gate electrode GE2' may be a top gate electrode disposed above each of the active layers ATV. In other words, the transistor TRb' may be a dual gate transistor including a top gate electrode and a bottom gate electrode.

The source-drain electrode SD' may be substantially the same as the source-drain electrode SD' as described with reference to FIGS. 7 and 8. In other words, the source-drain electrode SD' may overlap with an other part PT2' of each of the active layers ATV' when viewed in the plan view, and may electrically come into contact with each of the active layers ATV'.

Figure 11:
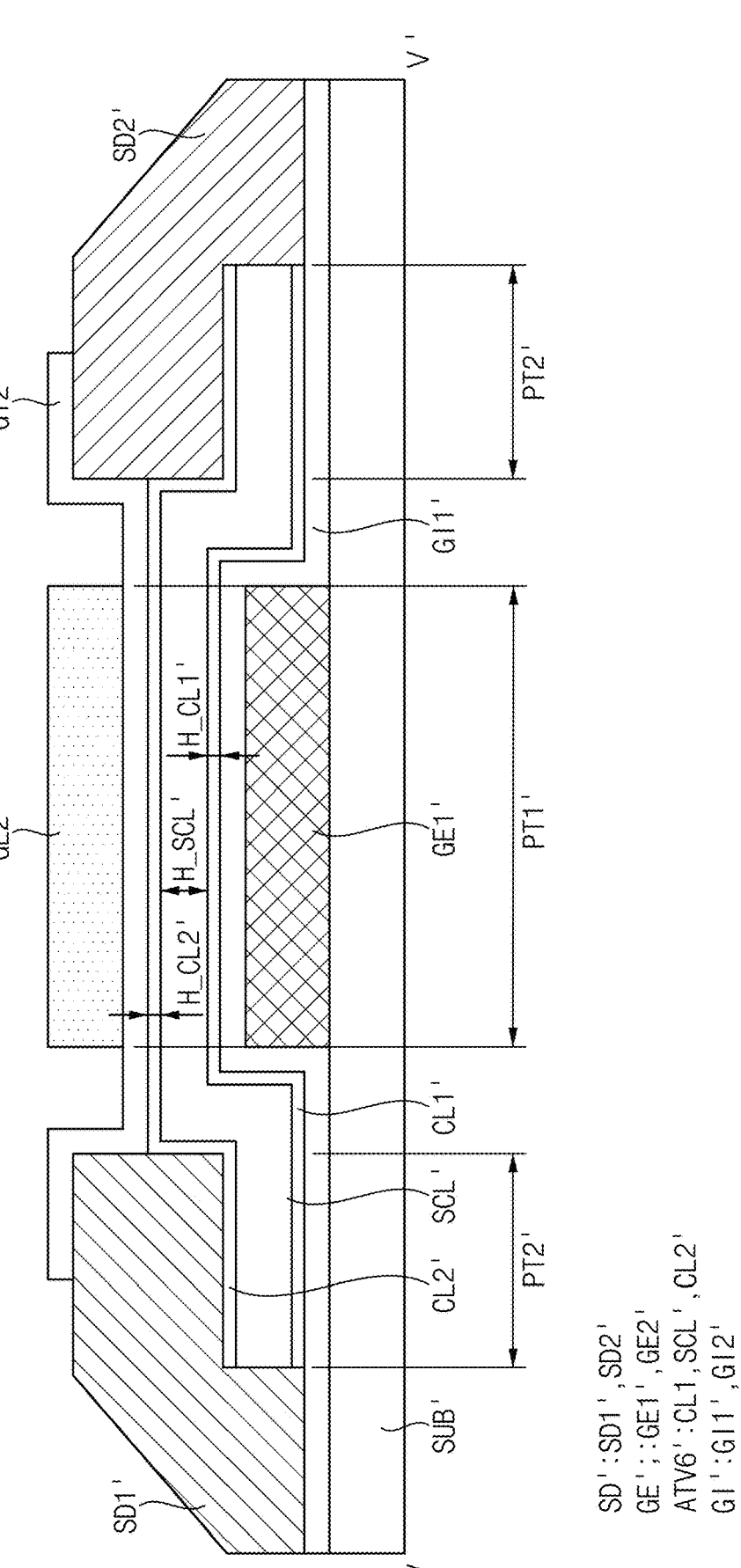
FIG. 11 is a sectional view taken along line V-V' of FIG. 10.

FIG. 11 is a sectional view taken along line V-V' of FIG. 10. For convenience of description, FIG. 11 shows only the sixth active layer ATV6, and each of the active layers ATV' not shown in FIG. 11 may have substantially the same structure as the sixth active layer ATV6.

Referring to FIG. 11, the transistor TRb' may include a substrate SUB', a sixth active layer ATV6, a source-drain electrode SD', a gate insulating layer GI' and a gate electrode GE'. In this case, the gate insulating layer GI' may include a first gate insulating layer GI1 and a second gate insulating layer GI2'.

The substrate SUB' may be substantially the same as the substrate SUB described with reference to FIG. 2. Although not shown in the drawings, a buffer layer may be further disposed above the substrate SUB'.

The first gate electrode GE1 may be disposed above the substrate SUB'. When the buffer layer is further disposed above the substrate SUB', the first gate electrode GE1 may be disposed above the buffer layer. The first gate electrode GE1 may include a conductive material.

The first gate insulating layer GI1 may be disposed above the substrate SUB', and may cover the first gate electrode GE1'. The first gate insulating layer GI1 may electrically insulate the first gate electrode GE1 from each of the active layers ATV. For example, as shown in FIG. 11, the gate insulating layer GI' may electrically insulate the gate electrode GE' from the sixth active layer ATV6. The gate insulating layer GI' may include an insulating material.

The sixth active layer ATV6 may be disposed above the first gate insulating layer GI1'. The sixth active layer ATV6 may be substantially the same as the sixth active layer ATV6 described with reference to FIG. 8. In other words, the sixth active layer ATV6 may include a first conductor layer CL1', a semiconductor material layer SCL', and a second conductor layer CL2'.

The second gate insulating layer GI2' may be disposed above the sixth active layer ATV6. The second gate insulating layer GI2' may electrically insulate the second gate electrode GE2' from each of the active layers ATV. For example, as shown in FIG. 11, the second gate insulating layer GI2' may electrically insulate the second gate electrode GE2' from the sixth active layer ATV6. The second gate insulating layer GI2' may include an insulating material.

The second gate electrode GE2' may be disposed above the second gate insulating layer GI2'. The second gate electrode GE2' may include a conductive material.

Each of the first gate electrode GE1' and the second gate electrode GE2' may overlap with the part PT1' of each of the active layers ATV'. For example, as shown in FIG. 11, each of the first gate electrode GE1' and the second gate electrode GE2' may overlap with a part of the sixth active layer ATV6. In this case, the part of the sixth active layer ATV6 may be referred to as a channel area.

The source-drain electrode SD' may be disposed above the substrate SUB. The source-drain electrode SD' may be substantially the same as the source-drain electrode SD' described with reference to FIG. 8. In other words, the source-drain electrode SD' may overlap with the other part PT2' of each of the active layers ATV', and may electrically come into contact with each of the active layers ATV'. For example, as shown in FIG. 11, the source-drain electrode SD' may overlap with other part of the sixth active layer ATV6, and may electrically come into contact with the sixth active layer ATV6. In this case, in the sixth active layer ATV6, the area electrically coming into contact with the source-drain electrode SD' may be referred to as a source area and a drain area.

The gate electrode GE', the first conductor layer CL1' and the second conductor layer CL2' may adjust electrical conductivity of the semiconductor material layer SCL'. For example, in the case that the transistor TRb is an N-MOS transistor, and when a voltage at a threshold voltage or higher is applied to the gate electrode GE', electrons of the semiconductor material layer SCL' may be condensed in the channel area, so that a channel may be formed. Accordingly, the semiconductor material layer SCL' may have electrical conductivity, and current may flow between the first source-drain electrode SD1' and the second source-drain electrode SD2' through the channel.

In this case, the first conductor layer CL1 and the second conductor layer CL2' may induce the formation of the channel in the semiconductor material layer SCL'. Accordingly, the first conductor layer CL1' and the second conductor layer CL2' may improve carrier mobility of the semiconductor material layer SCL'.

A thickness H_CL1' of the first conductor layer CL1 and a thickness H_CL2' of the second conductor layer CL2' may be relatively small. For example, the sum of the thickness H_CL1' of the first conductor layer CL1 and the thickness H_CL2' of the second conductor layer CL2' may be smaller than a thickness H_SCL' of the semiconductor material layer SCL'. When the thickness H_CL1' of the first conductor layer CL1 and the thickness H_CL2' of the second conductor layer CL2' are relatively large, current may flow between the first source-drain electrode SD1' and the second source-drain electrode SD2' through the first conductor layer CL1 and the second conductor layer CL2', regardless of the voltage applied to the gate electrode GE.

In an embodiment, each of the thickness H_CL1' of the first conductor layer CL1 and the thickness H_CL2' of the second conductor layer CL2' may be greater than or equal to about 0.1 nm and less than or equal to about 5 nm. Preferably, each of the thickness H_CL1' of the first conductor layer CL1 and the thickness H_CL2' of the second conductor layer CL2' may be greater than or equal to about 1.5 nm and less than or equal to about 3 nm. When each of the thickness H_CL1' of the first conductor layer CL1 and the thickness H_CL2' of the second conductor layer CL2' is less than about 0.1 nm, the first conductor layer CL1' and the second conductor layer CL2' may not substantially induce the formation of the channel in the semiconductor material layer SCL. In addition, when each of the thickness H_CL1' of the first conductor layer CL1 and the thickness H_CL2' of the second conductor layer CL2' is greater than about 5 nm, current may flow between the first source-drain electrode SD1' and the second source-drain electrode SD2' through the first conductor layer CL1' and the second conductor layer CL2', regardless of the voltage applied to the gate electrode GE.

Figure 12:
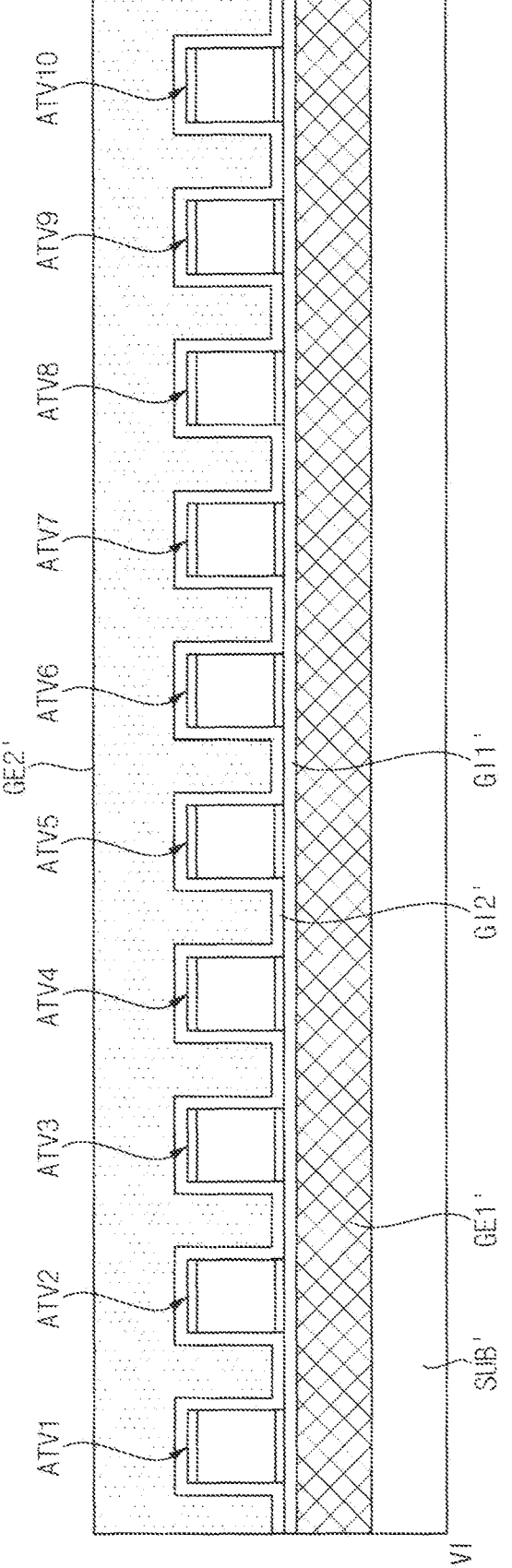
FIG. 12 is a sectional view taken along line VI-VI' of FIG. 10.

FIG. 12 is a sectional view taken along line VI-VI' of FIG. 10. Descriptions overlapping with those described in FIG. 11 will be omitted.

Referring to FIG. 12, the transistor TRb' may have a split channel structure including a plurality of active layers ATV'. Accordingly, the active layers ATV' may have relatively reduced resistance, so that carrier mobility of the transistor TRb may be improved.

In an embodiment, the second gate electrode GE2' may cover at least side surfaces of each of the active layers ATV. In other words, at least a part of the second gate electrode GE2' may be disposed between two active layers adjacent to each other among the active layers ATV' (for example, between the fifth active layer ATV5 and the sixth active layer ATV6).

Accordingly, in the case that the transistor TRb' is an N-MOS transistor, and when a voltage at a threshold voltage or higher is applied to the second gate electrode GE2', electrons may be further condensed on side surfaces of the semiconductor material layer SCL' included in each of the active layers ATV, so that the channel may be formed. Accordingly, carrier mobility of the transistor TRb' may be further improved.

In addition, in the case that the transistor TRb' is an N-MOS transistor, and when a voltage less than the threshold voltage is applied to the second gate electrode GE2', the second gate electrode GE2' may induce depletion at the side surfaces of the semiconductor material layer SCL' included in each of the active layers ATV. Accordingly, when the transistor TRb' is turned off (for example, when the voltage less than the threshold voltage is applied to the gate electrode GE'), leakage current of the transistor TRb' may be relatively reduced.

Figure 13:
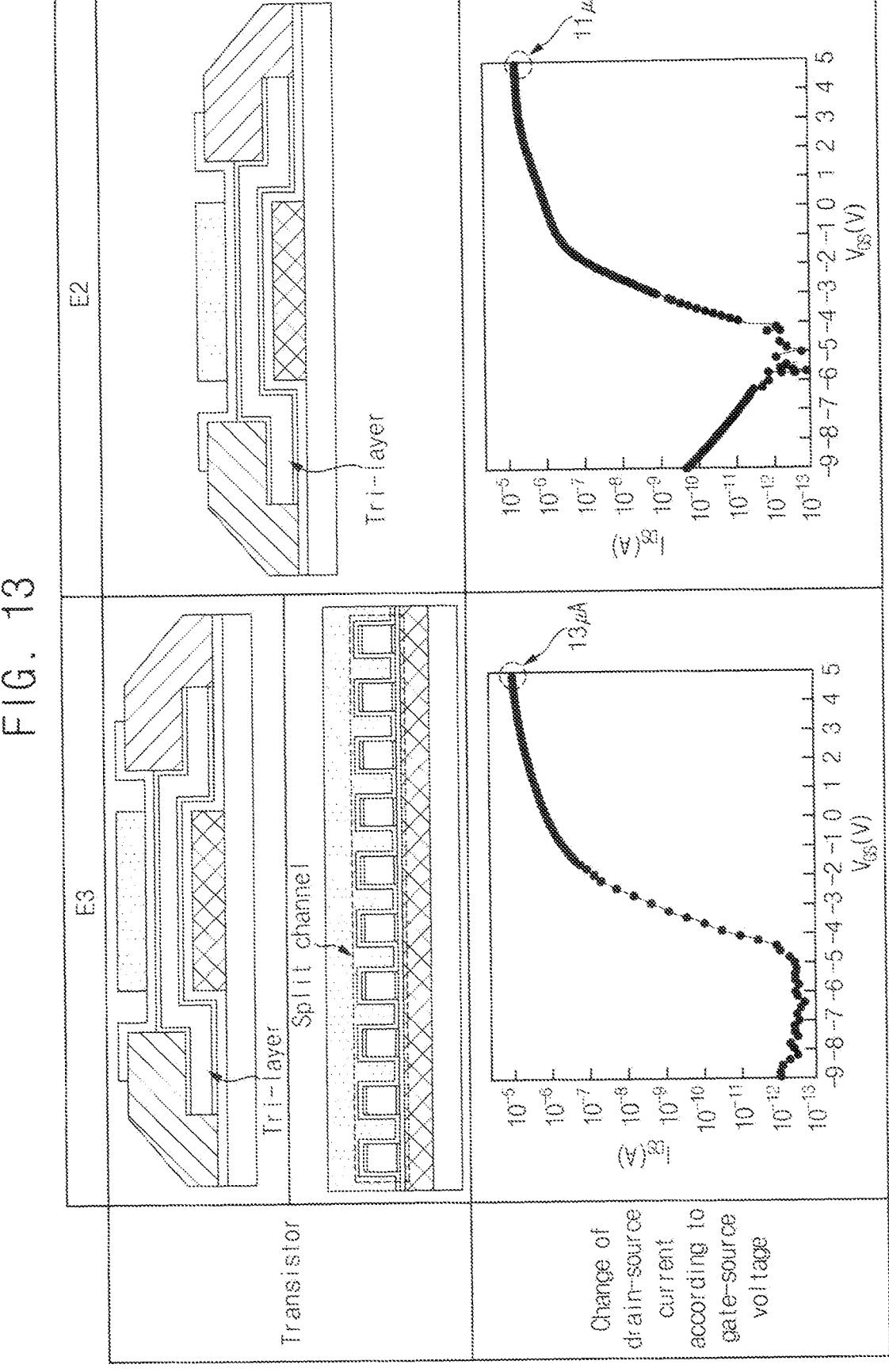
FIG. 13 are views for explaining device characteristics of the transistor shown in FIGS. 10, 11 and 12.

FIG. 13 are views for explaining device characteristics of the transistor shown in FIGS. 10, 11 and 12.

Referring to FIG. 13, FIG. 13 is a table comparing characteristics of the gate-source voltage VGS and drain-source current IDS of the transistor according to the third experimental example E3, with characteristics of the gate-source voltage VGS and drain-source current IDS of the transistor according to the second experimental example E2.

The transistor according to the third experimental example E3 has substantially the same structure as the transistor TRb according to a fourth embodiment of the present disclosure described with reference to FIGS. 10 to 12. More specifically, the transistor according to the third experimental example E3 is a dual gate transistor including a top gate electrode and a bottom gate electrode, and has a split channel structure including a plurality of active layers, in which each of the active layers has a tri-layer structure of ITO conductor layer/ITGZO semiconductor material layer/ITO conductor layer. In this case, the sectional thickness of each of the ITO conductor layers is about 4 nm, and the sectional thickness of the ITGZO semiconductor material layer is about 45 nm. In addition, the horizontal length of each of the active layers when viewed in a plan view is about 100 μm, and the vertical length of each of the active layers when viewed in the plan view is about 5 μm.

The transistor according to the second experimental example E2 has substantially the same structure as the transistor TRa' according to the second embodiment of the present disclosure described with reference to FIGS. 4 to 5. With respect to the transistor according to the second experimental example E2, descriptions substantially the same as those described with reference to FIG. 6 will be omitted.

When the gate-source voltage VGS of the transistor according to the third experimental example E3 is about 5V, the drain-to-source current IDS of the transistor according to the third experimental example E3 is about 13 μA. In addition, When the gate-source voltage VGS of the transistor according to the second experimental example E2 is about 5V, the drain-to-source current IDS of the transistor according to the second experimental example E2 is about 11 μA. In other words, when a turn-on voltage of the same level (for example, a voltage of 5V) is applied to the gate electrode, a transistor having a split channel structure (for example, the transistor according to the third experimental example E3) may have improved carrier mobility, compared to a transistor without a split channel structure (for example, the transistor according to the second experimental example E2).

The drain-source current IDS of the transistor according to the third experimental example E3 when the gate-source voltage VGS of the transistor according to the third experimental example E3 is about −6V or less, is lower than the drain-source current IDS of the transistor according to the second experimental example E2 when the gate-source voltage VGS of the transistor according to the second experimental example E2 is about −6V or less. In other words, when a turn-off voltage of the same level (for example, a voltage of about −6V or less) is applied to the gate electrode, a small amount of leakage current may flow in a transistor having a split channel structure (for example, the transistor according to the third experimental example E3), compared to a transistor without a split channel structure (for example, the transistor according to the second experimental example E2).

FIGS. 14 and 15 are views for explaining device characteristics of the transistor according to the embodiments of the present disclosure.

Referring to FIGS. 14 and 15, FIG. 14 is a table showing device characteristics of the transistor according to the first comparative example C1, the transistor according to the second comparative example C2, the transistor according to the third comparative example C3, the transistor according to the first experimental example E1, the transistor according to the second experimental example E2, and the transistor according to the third experimental example E3. In FIG. 14, On-current corresponds to the drain-source current IDS when a voltage of about 5 V is applied to the gate-source voltage VGS, and the carrier mobility is calculated based on the On-current.

The transistor according to the third comparative example C3 has substantially the same structure as the transistor TRb according to a third embodiment of the present disclosure described with reference to FIGS. 7 to 9, except for that each of the active layers has a single layer structure of an ITGZO semiconductor material layer. More specifically, the transistor according to the third comparative example C3 has a split channel structure including a plurality of active layers, in which each of the active layers has a single layer structure of an ITGZO semiconductor material layer. In this case, the sectional thickness of the ITGZO semiconductor material layer is about 45 nm, the horizontal length of each of the active layers when viewed in a plan view is 100 μm, and the vertical length of each of the active layers when viewed in the plan view is about 5 μm.

The carrier mobility of the transistor according to the first experimental example E1 is greater than each of the carrier mobility of the transistor according to the first comparative example C1, the carrier mobility of the transistor according to the second comparative example C2, and the carrier mobility of the transistor according to the third comparative example C3. In other words, the active layer of the transistor has the tri-layer structure of conductor/semiconductor/conductor, so that the carrier mobility may be improved.

The carrier mobility of the transistor according to the second experimental example E2 is greater than the carrier mobility of the transistor according to the first experimental example E1. In other words, when the active layer of the transistor has the tri-layer structure of conductor/semiconductor/conductor, the gate electrode of the transistor includes a top gate electrode and a bottom gate electrode (for example, the transistor is a dual gate transistor), so that the carrier mobility may be further improved.

The carrier mobility of the transistor according to the third experimental example E3 is greater than the carrier mobility of the transistor according to the first experimental example E1. In other words, when the active layer of the transistor has the tri-layer structure of conductor/semiconductor/conductor, the transistor has a split channel structure, so that the carrier mobility may be further improved.

The carrier mobility of the transistor according to the third experimental example E3 is greater than the carrier mobility of the transistor according to the first comparative example C1. For example, the carrier mobility of the transistor according to the third experimental example E3 may be about 9 times of the carrier mobility of the transistor according to the first comparative example C1. In other words, the active layer of the transistor has the tri-layer structure of conductor/semiconductor/conductor, the gate electrode of the transistor includes the top gate electrode and the bottom gate electrode, and the transistor has a split channel structure, so that the carrier mobility may be improved.

When the active layer of the transistor has the tri-layer structure of conductor/semiconductor/conductor (for example, in the case of the transistors according to the first to third experimental examples E1, E2 and E3), a threshold voltage VTH may be relatively low. In this case, as shown in FIGS. 3, 6 and 13, when the gate-source voltage VGS is less than the threshold voltage VTH, the drain-source current IDS may have a relatively low value. In other words, the device characteristics may be stable even when the active layer of the transistor has the tri-layer structure of conductor/semiconductor/conductor.

For example, as shown in FIGS. 3 and 13, the level of the drain-source current IDS when the voltage less than the threshold voltage VTH is applied to the gate electrode of the transistor according to the third experimental example E3 may be substantially the same as or substantially lower than the level of the drain-source current IDS when the voltage less than the threshold voltage VTH is applied to the gate electrode of the transistor according to the first comparative example C1. In other words, the transistor according to the third experimental example E3 may have relatively stable device characteristics, when compared to the transistor according to the first comparative example C1.

Although it has been described with reference to exemplary embodiments of the present disclosure, it will be apparent to a person having ordinary skill in the art that various modifications and variations can be made in the present disclosure without departing from the scope and field of the following appended claims.

The present disclosure may be applied to an electronic appliance including a display device. For example, the present disclosure may be applied to various electronic devices such as display devices for vehicles, ships and aircrafts, portable communication devices, display devices for exhibition or information delivery, and medical display devices.

What is claimed is:

1. A transistor comprising:
an active layer including a first conductor layer including metal atoms, a semiconductor material layer disposed above the first conductor layer, and a second conductor layer disposed above the semiconductor material layer and including the metal atoms;
a gate electrode overlapping a part of the active layer and electrically insulated from the active layer; and
a source-drain electrode overlapping an other part of the active layer different from the part of the active layer and electrically contacting the active layer,
wherein the gate electrode overlaps the first conductive layer, the semiconductor material layer, and the second conductive layer and does not overlap the source-drain electrode, and
wherein the first conductor layer induces the formation of a channel in a lower part of the semiconductor material layer adjacent to the first conductor layer, and the second conductor layer induces the formation of the channel in an upper part of the semiconductor material layer adjacent to the second conductor layer.

2. The transistor of claim 1, wherein the semiconductor material layer includes an oxide semiconductor material.

3. The transistor of claim 1, wherein the semiconductor material layer is a single layer.

4. The transistor of claim 1, wherein each of the first conductor layer and the second conductor layer further includes oxygen atoms.

5. The transistor of claim 4, wherein each of the first conductor layer and the second conductor layer includes at least one of indium tin oxide (ITO) and indium zinc oxide (IZO).

6. The transistor of claim 1, wherein the semiconductor material layer has a thickness greater than a sum of a thickness of the first conductor layer and a thickness of the second conductor layer.

7. The transistor of claim 1, wherein the first conductor layer has a thickness of 0.1 nm or more and 5 nm or less, and the second conductor layer has a thickness of 0.1 nm or more and 5 nm or less.

8. The transistor of claim 1, wherein the gate electrode includes:
a first gate electrode disposed below the active layer and overlapping with the part of the active layer; and
a second gate electrode disposed above the active layer and overlapping with the part of the active layer.

9. The transistor of claim 8, further comprising:
a first gate insulating layer disposed between the first gate electrode and the active layer, and electrically insulating the first gate electrode from the active layer; and
a second gate insulating layer disposed between the second gate electrode and the active layer, and electrically insulating the second gate electrode from the active layer.

10. A transistor comprising:
a plurality of active layers each including a first conductor layer including metal atoms, a semiconductor material layer disposed above the first conductor layer, and a second conductor layer disposed above the semiconductor material layer and including the metal atoms, and arranged in a direction while being spaced apart from each other in the direction;

a gate electrode overlapping with a part of each of the active layers and electrically insulated from the active layers, a first source-drain electrode overlapping an other part of each of the active layers different from the part of each of the active layers and electrically contacting the active layers; and a second source-drain electrode spaced apart from the first source-drain electrode and electrically contacting the active layers, wherein the active layers are disposed between the same first source-drain electrode and the same second source-drain electrode.

11. The transistor of claim 10, wherein the semiconductor material layer includes an oxide semiconductor material.

12. The transistor of claim 10, wherein the semiconductor material layer is a single layer.

13. The transistor of claim 10, wherein each of the first conductor layer and the second conductor layer further includes oxygen atoms.

14. The transistor of claim 13, wherein each of the first conductor layer and the second conductor layer includes at least one of indium tin oxide (ITO) and indium zinc oxide (IZO).

15. The transistor of claim 10, wherein the semiconductor material layer has a thickness greater than a sum of a thickness of the first conductor layer and a thickness of the second conductor layer.

16. The transistor of claim 10, wherein the first conductor layer has a thickness of 0.1 nm or more and 5 nm or less, and the second conductor layer has a thickness of 0.1 nm or more and 5 nm or less.

17. The transistor of claim 10, wherein the gate electrode covers at least side surfaces of each of the active layers spaced apart from each other.

18. The transistor of claim 10, wherein the gate electrode includes:

a first gate electrode disposed below the active layers and overlapping with the part of each of the active layers; and a second gate electrode disposed above the active layers and overlapping with the part of each of the active layers.

19. The transistor of claim 18, wherein the second gate electrode covers at least side surfaces of each of the active layers spaced apart from each other.

20. The transistor of claim 18, further comprising:

a first gate insulating layer disposed between the first gate electrode and the active layers and electrically insulating the first gate electrode from the active layer; and a second gate insulating layer disposed between the second gate electrode and the active layer and electrically insulating the second gate electrode from the active layer.

* * * * *